(12) United States Patent
Terashita et al.

(10) Patent No.: US 10,193,007 B2
(45) Date of Patent: Jan. 29, 2019

(54) SOLAR CELL MODULE AND METHOD FOR MANUFACTURING SAME

(71) Applicant: KANEKA CORPORATION, Osaka-shi, Osaka (JP)

(72) Inventors: Toru Terashita, Settsu (JP); Daisuke Adachi, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 39 days.

(21) Appl. No.: 15/127,390

(22) PCT Filed: Mar. 26, 2015

(86) PCT No.: PCT/JP2015/059509
§ 371 (c)(1),
(2) Date: Sep. 19, 2016

(87) PCT Pub. No.: WO2015/147225
PCT Pub. Date: Oct. 1, 2015

(65) Prior Publication Data
US 2017/0155007 A1  Jun. 1, 2017

(30) Foreign Application Priority Data
Mar. 26, 2014 (JP) .................. 2014-064263

(51) Int. Cl.
*H01L 31/052* (2014.01)
*H01L 31/05* (2014.01)
(Continued)

(52) U.S. Cl.
CPC .. *H01L 31/0512* (2013.01); *H01L 31/022425* (2013.01); *H01L 31/0747* (2013.01); *Y02E 10/50* (2013.01)

(58) Field of Classification Search
CPC ......... H01L 31/0512; H01L 31/022425; H01L 31/0747
(Continued)

(56) References Cited

U.S. PATENT DOCUMENTS 5,380,371 A    1/1995 Murakami
2002/0153039 A1    10/2002 Moon et al.
(Continued)

FOREIGN PATENT DOCUMENTS

JP    H0563218 A    3/1993
JP    H10150214 A    6/1998
(Continued)

OTHER PUBLICATIONS

English translation of JP 2011-054660 (Year: 2011).*
(Continued)

*Primary Examiner* — Magali P Slawski
*Assistant Examiner* — Kourtney R S Carlson
(74) *Attorney, Agent, or Firm* — Alleman Hall Creasman & Tuttle LLP

(57) ABSTRACT

This solar cell module includes a solar cell and a wiring member. The solar cell includes a collecting electrode on a light-receiving side of a photoelectric conversion section, and a back electrode on a back side of the photoelectric conversion section. Sequentially from the photoelectric conversion section side, the collecting electrode includes a first collecting electrode and a second collecting electrode, and the back electrode comprises a first back electrode and a second back electrode. It is preferable that the surface roughness Ra1 of the first collecting electrode and the surface roughness Ra2 of the second collecting electrode satisfy Ra1≥Ra2 and Ra2=1.0 to 10.0 μm. It is also preferable that the outermost layer of the second collecting electrode and the outermost layer of the second back electrode
(Continued)

are mainly composed of the same electroconductive material.

14 Claims, 8 Drawing Sheets

(51) Int. Cl.
*H01L 31/0224* (2006.01)
*H01L 31/0747* (2012.01)

(58) Field of Classification Search
USPC .................................. 136/242–265
See application file for complete search history.

(56) References Cited

U.S. PATENT DOCUMENTS

| | | | | |
|---|---|---|---|---|
| 2008/0121266 A1* | 5/2008 | Tsunomura | ......... | H01L 31/0747 136/244 |
| 2010/0116314 A1* | 5/2010 | Fukushima | ................ | C09J 9/02 136/244 |
| 2011/0139212 A1* | 6/2011 | Hong | ................ | H01L 31/02243 136/244 |
| 2012/0060911 A1* | 3/2012 | Fu | ..................... | H01L 31/02242 136/256 |
| 2013/0312827 A1 | 11/2013 | Adachi et al. | | |

FOREIGN PATENT DOCUMENTS

| | | |
|---|---|---|
| JP | 2002329880 A | 11/2002 |
| JP | 2011054660 A | 3/2011 |
| JP | 2011061109 A | 3/2011 |
| JP | 2011204955 A | 10/2011 |
| JP | 2013012606 A | 1/2013 |
| WO | 2013077038 A1 | 5/2013 |

OTHER PUBLICATIONS

International Bureau of WIPO, International Preliminary Report on Patentability Issued in Application No. PCT/JP2015/059509, dated Oct. 6, 2016, WIPO, 8 pages.
ISA Japan Patent Office, International Search Report Issued in Application No. PCT/JP2015/059509, dated Jun. 9, 2015, WIPO, 4 pages.

* cited by examiner before annealing
(after printing)    after annealing before sintering after sintering onset
(initial sintering stage)

grain boundary after sintering onset

SOLAR CELL MODULE AND METHOD FOR MANUFACTURING SAME

TECHNICAL FIELD

The present invention relates to a solar cell module and a method for of manufacturing the same.

BACKGROUND ART

Since energy issues and global environmental issues are becoming more serious, solar cells are receiving more attention as an alternative energy for replacing fossil fuels. In the solar cell, carriers (electrons and holes) generated by light irradiation on a photoelectric conversion section composed of a semiconductor junction or the like are extracted to an external circuit to generate electricity.

A collecting electrode is provided on the photoelectric conversion section of the solar cell for efficiently extracting carriers generated at the photoelectric conversion section to the external circuit. For example, in a crystalline silicon-based solar cell using a single-crystalline silicon substrate or a polycrystalline silicon substrate, a collecting electrode made of fine metal is provided on a light-receiving surface. Also, in a heterojunction solar cell having amorphous silicon layers and transparent electrode layers on a crystalline silicon substrate, collecting electrode(s) are provided on the transparent electrode layer(s).

The collecting electrode of the solar cell is generally formed by pattern-printing a silver paste by a screen printing method. On the other hand, a method of forming a collecting electrode by a plating method has also been developed. For example, Patent Document 1 discloses a method in which an insulating layer is formed on a first collecting electrode including a low-melting-point material, the low-melting-point material is thermally fluidized to form an opening section in the insulating layer by heat annealing, and then a second collecting electrode is formed through the opening by electroplating.

Patent Document 2 discloses a method in which each of the collecting electrodes on the front side and the back side is formed of a plurality of layers including a first electrode electroconductive layer having a high light reflectance and a second electrode electroconductive layer having a low electric resistance. Patent Document 2 describes that collecting electrodes on the front side and the back side can be a plating method, and that when the collecting electrodes on the front side and the back side are made of the same material, these collecting electrodes can be formed simultaneously in the same step, so that the process can be simplified.

Patent Document 3 discloses a method in which an insulating film composed of $SiO_2$ is formed on a transparent electrode layer, an insulating layer is then patterned using a resist, and a metal layer is formed in the opening by electroplating.

PRIOR ART DOCUMENTS

Patent Documents

Patent Document 1: WO2013/077038
Patent Document 2: JP-A-2013-012606
Patent Document 3: JP-A-2011-204955

SUMMARY OF THE INVENTION

Problems to be Solved by the Invention

Solar cells are generally modularized by connecting a plurality of cells via a wiring member in series or in parallel. In modularization, collecting electrodes of the solar cell are electrically connected to the wiring member. Accordingly, for improving the conversion characteristics of the solar cell module, it is important to improve connectivity between the collecting electrode and the wiring member by increasing adhesion between the collecting electrode of the solar cell to the wiring member.

Further, in many cases, the solar cell module is installed outdoors, and used for a long period of time, i.e., for 10 years or more. Accordingly, there arises the problem that during use, the wiring member is detached from the collecting electrode of the solar cell, or the solar cell is warped to be damaged, resulting in deterioration of the conversion characteristics. Therefore, it is required to secure reliability of solar cell module. For improving the reliability, it is effective to improve connectivity between the collecting electrode and the wiring member by increasing adhesion between the collecting electrode of the solar cell to the wiring member.

However, in Patent Documents 1 and 2, improvement of connectivity between the collecting electrode and the wiring member is not mentioned at all, and reliability of the solar cell module with respect to a temperature change is not recognized.

Patent Document 3 proposes that by adjusting the plating current density and the like during formation of a collecting electrode to control the surface roughness Ra of the collecting electrode within a range of 0.1 to 0.6 μm, adhesion between a plating electrode and an electroconductive adhesive for bonding the plating electrode and a wiring member can be improved. However, studies by the inventors show that when Ra is in the range proposed in Patent Document 3, sufficient module initial performance and reliability cannot be secured because adhesion between the collecting electrode and the electroconductive adhesive is not sufficient, and therefore connectivity between the collecting electrode and the wiring member is not sufficient.

An object of the present invention is to improve the conversion efficiency and reliability of a solar cell module by solving the above-mentioned problems of conventional techniques related to formation of a collecting electrode of a solar cell.

SUMMARY OF THE INVENTION

Problems to be Solved by the Invention

In view of the problems described above, the inventors have extensively conducted studies, and resultantly found that by employing a module structure including a solar cell provided with a specific collecting electrode and back electrode, adhesion between the collecting electrode of the solar cell and the wiring member can be increased to improve connectivity between the collecting electrode and the wiring member, and consequently the conversion efficiency and reliability of the solar cell module can be improved.

The present invention relates to a solar cell module including a solar cell and a wiring member. The solar cell includes a photoelectric conversion section, a collecting electrode provided on the light-receiving side of the photoelectric conversion section, and a back electrode provided on the back side of the photoelectric conversion section. The collecting electrode includes a first collecting electrode and a second collecting electrode in this order from the photoelectric conversion section side. The back electrode includes a first back electrode and a second back electrode in this order from the photoelectric conversion section side. The second collecting electrode and the second back electrode each have one layer, or two or more layers. It is preferable to satisfy the requirement of Ra1≥Ra2 and Ra2=1.0 µm to 10.0 µm where Ra1 is the surface roughness of the first collecting electrode and Ra2 is the surface roughness of the second collecting electrode. Preferably, the outermost layer of the second collecting electrode and the outermost layer of the second back electrode are mainly composed of the same electroconductive material. The wiring member includes a core material and a conductor that covers the surface of the core material. The collecting electrode of the solar cell and the conductor of the wiring member are electrically connected to each other, and the solar cell is electrically connected to another solar cell via the wiring member. Preferably, the back electrode of the solar cell and a conductor of another wiring member are electrically connected to each other.

In one embodiment, the first collecting electrode is a layer containing a resin, and the second collecting electrode is a plated layer.

In one embodiment, the collecting electrode further includes an insulating layer provided with an opening section between the first collecting electrode and the second collecting electrode, and the second collecting electrode is conductively connected with the first collecting electrode via the opening section of the insulating layer. In this case, it is preferable that the first collecting electrode contains a low-melting-point material, and the thermal-fluidization onset temperature $T_1$ of the low-melting-point material is lower than the heat-resistant temperature of the photoelectric conversion section.

In one embodiment, the second collecting electrode is in contact with the conductor of the wiring member. Preferably, the second back electrode is in contact with a conductor of another wiring member.

Preferably, the electroconductive material and the conductor of the wiring member are each mainly composed of tin.

Preferably, the second collecting electrode includes a first layer of the second collecting electrode and a second layer of the second collecting electrode in this order from the photoelectric conversion section side, the second back electrode includes a first layer of the second back electrode and a second layer of the second back electrode in this order from the photoelectric conversion section side, and the second layer of the second collecting electrode and the second layer of the second back electrode are mainly composed of the same electroconductive material.

In one embodiment, the back electrode has a pattern shape.

The present invention relates to a method for manufacturing the above solar cell module. The manufacturing method according to the present invention includes the steps of: forming a collecting electrode on the light-receiving side of a photoelectric conversion section; and forming a back electrode on the back side of the photoelectric conversion section. Preferably, formation of the collecting electrode includes the steps of forming a first collecting electrode and forming a second collecting electrode from the photoelectric conversion section side, and formation of the back electrode includes the steps of forming a first back electrode and forming a second back electrode from the photoelectric conversion section side.

Preferably, the second collecting electrode and the second back electrode are each formed by a plating method.

Preferably, the outermost layer of the second collecting electrode and the outermost layer of the second back electrode are formed at the same time.

In one embodiment, the first collecting electrode is formed using a paste containing a resin, and the second collecting electrode is formed by a plating method.

In one embodiment, formation of the collecting electrode further includes the step of forming an insulating layer provided with an opening section on the first collecting electrode after forming the first collecting electrode and before forming the second collecting electrode, and the second collecting electrode is formed by a plating method in such a manner that the second collecting electrode is conductively connected with the first collecting electrode via the opening section of the insulating layer. In this embodiment, it is preferable that the first collecting electrode contains a low-melting-point material, and after the insulating layer is formed and before the second collecting electrode is formed, or at the time when the insulating layer is formed, the first collecting electrode is subjected to an annealing treatment at an annealing temperature Ta that is higher than the thermal-fluidization onset temperature $T_1$ of the low-melting-point material, so that the opening section is formed in the insulating layer.

EFFECTS OF THE INVENTION

DESCRIPTION OF EMBODIMENT

[Solar Cell Module]

Figure 1:
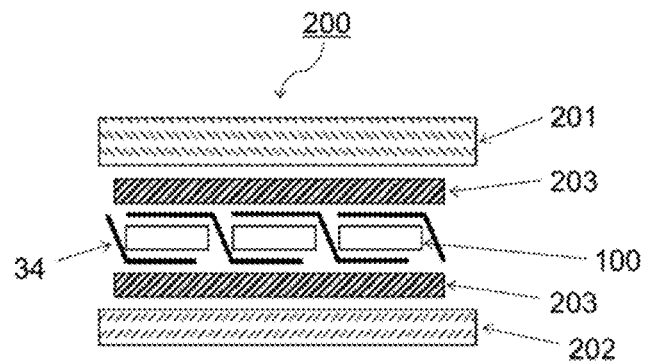
FIG. 1 is a schematic sectional view showing a solar cell module according to one embodiment of the present invention.

FIG. 1 is a schematic sectional view of a solar cell module according to one embodiment of the present invention. The solar cell module 200 shown in FIG. 1 includes a plurality of solar cells 100. The solar cell 100 is electrically connected to another solar cell or an external electrode via a wiring member 34. In this way, a plurality of solar cells 100 are connected in series or in parallel.

Protective materials 201 and 202 are disposed on the light-receiving side and the back side, respectively, of each solar cells 100. A sealing material 203 is provided between the light-receiving side protective material 201 and the back side protective material 202, and solar cells 100 are sealed with the sealing material 203.

In preparation of the solar cell module, first, a solar cell string in which a plurality of solar cells 100 are mutually connected via the wiring member 34 is prepared. The solar cell string is sandwiched between the light-receiving side protective material 201 and the back side protective material 202 with the sealing material 203 interposed between the solar cell string and each protective material, so that the solar cell module is formed. In formation of the solar cell module, is preferable that as shown in FIG. 1, the sealing material 203, the solar cell string, the sealing material 203 and the back side protective material 202 are sequentially stacked on the light-receiving side protective material 201 to obtain a laminated body. Preferably, the laminated body is then heated under a predetermined condition to cure the sealing material 203. Then, an Al frame (not illustrated) etc. is attached to prepare the solar cell module 200.

Preferably, the light-receiving side protective material 201 is disposed on the light-receiving side (light-incident side) of each solar cells 100 to protect the surface of the solar cell module. As the light-receiving side protective material, a light-transmissive and water-permeable glass, a light-transmissive plastic, or the like can be used. Preferably, the back side protective material 202 is disposed on the back side of each solar cells 100 to protect the back surface of the solar cell module. As the back side protective material, a resin film of polyethylene terephthalate (PET) or the like, a laminated film having a structure in which an Al foil is sandwiched between resin films, or the like can be used.

The sealing material 203 seals the solar cell string between the light-receiving side protective material 201 and the back side protective material 202. As the sealing material, a light-transmissive resin such as an ethylene-vinyl acetate copolymer resin (EVA), an ethylene-ethyl acrylate copolymer resin (EEA), a polyvinyl butyral resin (PVB), a silicone resin, a urethane resin, an acrylic resin or an epoxy can be used.

The solar cell module 200 can be prepared as described above. The basic structure and the method for preparation of the solar cell module is not limited to those described above.

Figure 2:
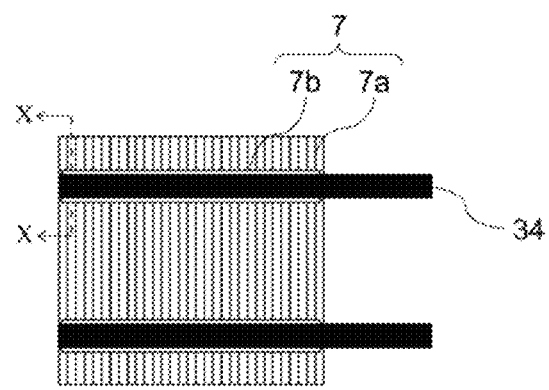
FIG. 2 is a schematic plan view of a solar cell module and a wiring member on light-receiving side.
Figure 3:
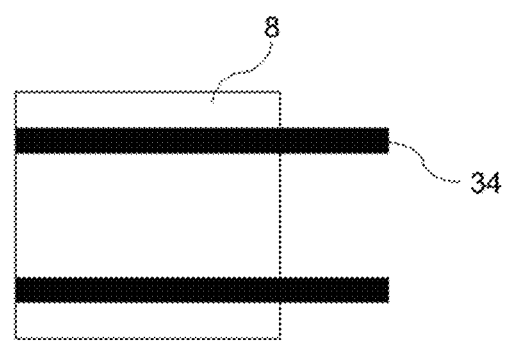
FIG. 3 is a schematic plan view of a solar cell module and a wiring member on back side.
Figure 4:
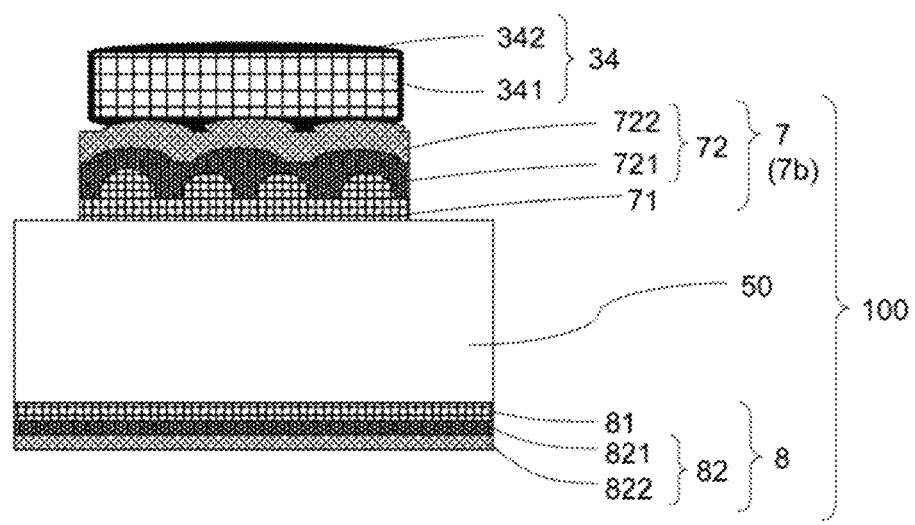
FIG. 4 is a sectional view taken along line X-X in FIG. 2.

FIG. 2 is a schematic plan view, on the light-receiving side, of the solar cell and the wiring member which form the solar cell module. FIG. 3 is a schematic plan view, on the back side, of the solar cell and the wiring member which form the solar cell module. FIG. 4 is a sectional view taken along line X-X in FIG. 2, and schematically shows a part of the solar cell module. The basic structure of the solar cell and the wiring member will be described with reference to FIGS. 2 to 4.

As schematically shown in FIG. 4, the solar cell 100 includes a collecting electrode 7 on one principal surface (light-receiving surface) of a photoelectric conversion section 50, and a back electrode 8 on the other principal surface (back surface) of the photoelectric conversion section 50. The collecting electrode 7 includes a first collecting electrode 71 and a second collecting electrode 72 in this order from the photoelectric conversion section 50 side. The back electrode 8 includes a first back electrode 81 and a second back electrode 82 in this order from the photoelectric conversion section 50 side. In the present invention, it is preferable that the second collecting electrode 72 includes two layers: a first layer 721 of the second collecting electrode and a second layer 722 of the second collecting electrode in this order from the photoelectric conversion section 50 side as shown in FIG. 4. Preferably, the second back electrode 82 includes two layers: a first layer 821 of the second back electrode and a second layer 822 of the second back electrode in this order from the photoelectric conversion section 50 side.

As shown in FIG. 2, the collecting electrode 7 includes a plurality of finger electrodes 7a formed so as to extend at fixed intervals in parallel to one another, and a bus bar electrode 7b which gathers currents collected by the finger electrodes 7a. Generally, the bus bar electrode 7b is formed so as to be substantially orthogonal to the finger electrodes 7a. It is preferable that on the light-receiving side, the bus bar electrode 7b of the collecting electrode 7 and the wiring member 34 are connected to each other as shown in FIGS. 2 and 4. When the collecting electrode includes finger electrodes and a bus bar electrode, at least a collecting electrode (bus bar electrode 7b in FIG. 2) in a region where the wiring member is connected may have a structure including the first collecting electrode and the second collecting electrode.

On the other hand, it is preferable that on the back side, the back electrode 8 covers the whole surface of the photoelectric conversion section, and the back electrode 8 and the wiring member 34 are connected to each other as shown in FIG. 3.

In the present invention, the collecting electrode 7 of the solar cell 100 and the wiring member 34 are connected to each other. In FIG. 4, the second collecting electrode 72 of the collecting electrode 7 is electrically connected to the wiring member 34. The back electrode 8 of the solar cell 100 and another wiring member (not illustrated) are connected to each other. The second back electrode 82 of the back electrode 8 is electrically connected to another wiring member (not illustrated in FIG. 4). As shown in FIG. 4, the wiring member 34 is formed of a core material 341 and a conductor 342 covering the surface of the core material 341.

While the material of the wiring member is not particularly limited, it is preferable to use a copper foil as the core material, and a solder as the conductor. Thus, it is preferable to use a copper foil whose surface is covered with a solder layer as the wiring member. When a solder layer is formed on the surface of a copper foil, an effect of preventing corrosion of the copper foil surface is exerted, and the solder layer serves to electrically connect the wiring member to the collecting electrode.

As a material that forms the solder, an alloy solder mainly composed of Sn and containing at least one element selected from Cu, Ni, Ag and Pb is preferable. Examples thereof include alloys containing 96.5% by mass of Sn, 3.0% by mass of Ag and 0.5% by mass of Cu; alloys containing 99 to 99.5% by mass of Sn and 0.5 to 1.0% by mass of Cu; alloys containing 1 to 1.5% by mass of Ag and 30 to 50% by mass (exclusive of 50% by mass) of Bi, with Sn constituting the balance; alloys containing 60% by mass of Sn and 40% by mass of Pb; and alloys containing 0.05 to 2.0% by mass of Cu and 0.001 to 2.0% by mass of Ni, with Sn constituting the balance. In addition, alloys mainly composed of Sn and containing Cu, Ni, Ag, Bi, In and so on are also preferable.

The thickness of the solder layer is preferably 60 µm or less because it should prevent oxidation of the copper foil, and serve to electrically contact to the collecting electrode. The thickness of the solder layer is preferably about 40 µm for suppressing unevenness of the thickness in the solder-plating step, and reducing costs.

Figure 5:
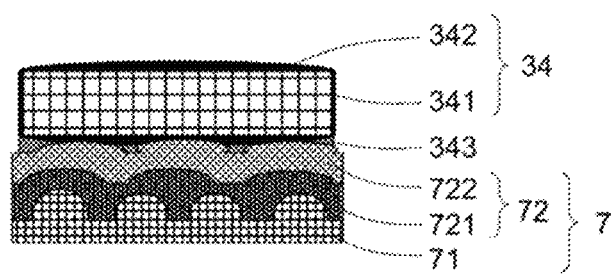
FIG. 5 is a sectional view schematically showing connection between a collecting electrode and a wiring member in another embodiment.

In FIG. 4, the collecting electrode 7 and the conductor 342 of the wiring member 34 are electrically connected to each other by bringing the conductor 342 of the wiring member 34 into contact with the second collecting electrode 72 by soldering etc. Alternatively, the collecting electrode 7 and the wiring member 34 may be electrically connected to each other by bonding the conductor 342 of the wiring member 34 to the second collecting electrode 72 using an electroconductive adhesive 343 containing electroconductive fine particles as shown in FIG. 5. For reducing costs and improving productivity, a method is preferable in which the conductor of the wiring member is brought into contact with the second collecting electrode, without using an electroconductive adhesive. Connecting the back electrode and the wiring member to each other is also preferably carried out by a method in which the second back electrode is brought into contact with the conductor of another wiring member, without using an electroconductive adhesive.

As the electroconductive adhesive, for example, one obtained by adding electroconductive fine particles to a resin paste can be used. As the resin paste, for example, an epoxy resin, an imide resin, a phenol resin or the like is used. As the electroconductive fine particles, for example, metal powder of Ni, Cu, Zn, In or the like is used. In place of metal powder, electroconductive powder such as carbon powder, or insulating fine particles which are composed of an epoxy resin, an acrylic resin, a polyimide resin, a phenol resin or the like and whose surfaces are coated with an electroconductive material such as a metal can be used as electroconductive fine particles.

In the present invention, a crystalline silicon-based solar cell is preferably used as the solar cell. The structure of the solar cell will be described more in detail below taking as an example a heterojunction crystalline silicon solar cell (also referred to as a "heterojunction solar cell"). The heterojunction solar cell is a crystalline silicon-based solar cell in which a silicon-based thin-film having a band gap different from that of a single-crystalline silicon is formed on a surface of a single-crystalline silicon substrate of a first conductivity-type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is known as one configuration of a crystalline silicon solar cell with the highest conversion efficiency.

Figure 6:
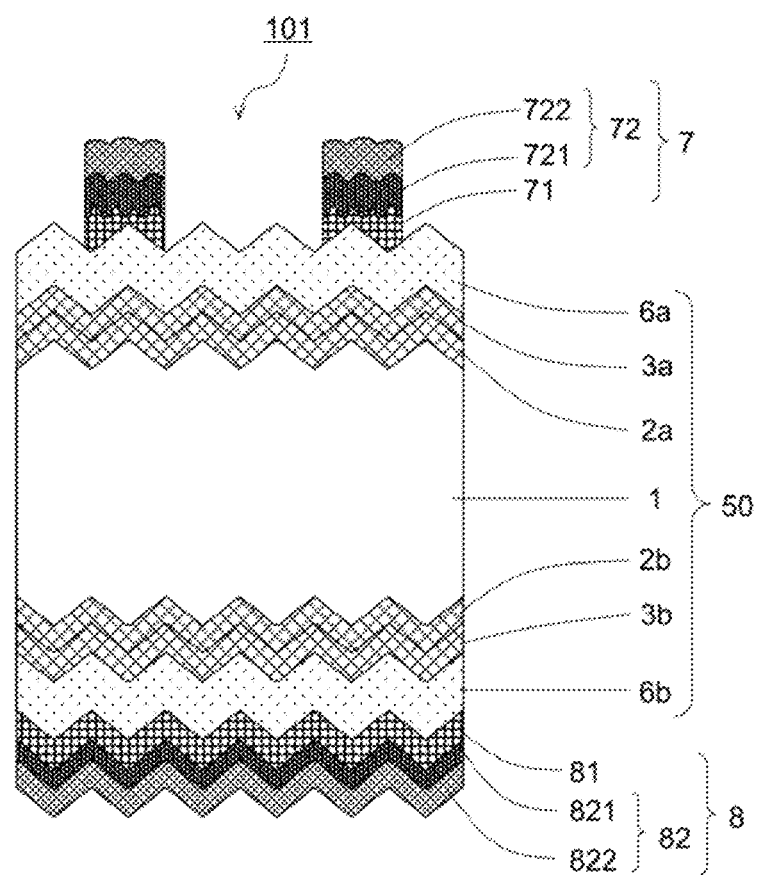
FIG. 6 is a schematic sectional view showing a heterojunction solar cell according to one embodiment.

FIG. 6 is a schematic sectional view of a heterojunction solar cell according to one embodiment of the present invention. The solar cell 101 shown in FIG. 6 includes, as a photoelectric conversion section 50, a conductive silicon-based thin-film 3a and a transparent electrode layer 6a in this order on one surface (surface on the light-incident side, light-receiving surface) of a substrate 1. A conductive silicon-based thin-film 3b and a transparent electrode layer 6b are provided in this order on the other surface (surface on the light reflecting side, back surface) of the substrate 1. A collecting electrode 7 is provided on the transparent electrode layer 6a of the surface of the photoelectric conversion section 50, and a back electrode 8 is stacked on the transparent electrode layer 6b. It is preferable that the solar cell 101 includes intrinsic silicon-based thin-films 2a and 2b between the substrate 1 and the conductive silicon-based thin-films 3a and 3b.

The substrate 1 is formed of a single-crystalline silicon substrate of first conductivity-type. Generally, the single-crystalline silicon substrate is classified into an n-type which contains atoms for introducing electrons into silicon atoms (e.g., phosphorus) and a p-type which contains atoms for introducing holes into silicon atoms (e.g., boron). That is, the "first conductivity-type" is one of the n-type and the p-type. In other words, the substrate 1 is one of the n-type or the p-type. In this embodiment, the substrate 1 is preferably an n-type single-crystalline silicon substrate.

Preferably, the substrate 1 has a textured structure on the light-receiving surface and the back surface. In other words, it is preferable the photoelectric conversion section 50 formed with the substrate 1 as a base also has a textured structure. In this case, the solar cell 101 can confine incident light in the photoelectric conversion section 50, so that power generation efficiency is improved.

The method for forming silicon-based thin-films 2a, 3a, 2b and 3b is preferably a plasma enhanced CVD. Each of Conductive silicon-based thin-films 3a and 3b is a silicon-based thin-film of first conductivity-type or opposite conductivity-type. The "opposite conductivity-type" means a conductivity-type different from that of the "first conductivity-type". For example, when the "first conductivity-type" is n-type, the "opposite conductivity-type" is p-type. In this embodiment, it is preferable that the conductive silicon-based thin-film 3a is a silicon-based thin-film of opposite conductivity-type and the conductive silicon-based thin-film 3b is a silicon-based thin-film of first conductivity-type. Although the silicon-based thin-film is not particularly limited, it is preferable to use an amorphous silicon-based thin-film. In this embodiment, it is preferable that the conductive silicon-based thin-film 3a is a p-type amorphous silicon-based thin-film and the conductive silicon-based thin-film 3b is an n-type amorphous silicon-based thin-film.

The intrinsic silicon-based thin-films 2a and 2b are preferably i-type hydrogenated amorphous silicon composed of silicon and hydrogen.

The photoelectric conversion section 50 of the solar cell 101 preferably includes transparent electrode layers 6a and 6b on the conductive silicon-based thin-films 3a and 3b, respectively. The method for forming transparent electrode layers 6a and 6b is not particularly limited, and examples thereof include a sputtering method.

The transparent electrode layers 6a and 6b preferably include a conductive oxide as a main component. As the conductive oxide, indium-based oxides including indium oxide are preferable. Among them, those having indium tin oxide (ITO) as a main component are more preferable. Here, the wording "as a main component" means that the content is more than 50% by weight, preferably 65% by weight or more, more preferably 80% by weight or more. The transparent electrode layer may be a single layer or a layered structure composed of multiple layers. A dopant can be added to the transparent electrode layer.

The thickness of the light-incident side transparent electrode layer 6a is preferably set to 10 nm or more and 140 nm or less, in view of transparency, electroconductivity, and reduction of light reflection. The role of the transparent electrode layer 6a is to transport carriers to the collecting electrode 7, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer 6a can also be prevented, and therefore a reduction in photoelectric conversion efficiency associated with a reduction in transmittance in an infrared range is also suppressed.

The collecting electrode 7 including the first collecting electrode 71 and the second collecting electrode 72 is formed on the light-incident side transparent electrode layer 6a. As described above, the second collecting electrode 72 is an electrode which is connected to the wiring member in modularization of the solar cell. By providing the first collecting electrode 71 between the second collecting electrode 72 and the transparent electrode layer 6a, adhesion between the transparent electrode layer 6a and the collecting electrode is increased.

Preferably, the collecting electrode is formed by a plating method for improving the efficiency of the solar cell (particularly, improving the fill factor by reducing the resistance). This is because a metal layer formed by a plating method has a higher electroconductivity as compared to a metal layer formed using a paste containing a resin material. In the present invention, it is preferable that the first collecting electrode 71 is formed as an electroconductive underlayer serving as an origination point, and the second collecting electrode 72 is formed as a plated layer on the electroconductive underlayer. For example, the first collecting electrode 71 is a layer containing a resin, and the second collecting electrode 72 is a plated layer. When the first collecting electrode 71 is formed using an electroconductive paste containing an electroconductive material and a resin, a pattern corresponding to the shape of a finger electrode or a bus bar electrode can be easily formed by screen printing etc. When an electroconductive layer containing a resin is formed as the first collecting electrode 71, adhesion between the transparent electrode layer and the collecting electrode can be increased as compared to a case where a plated layer is formed directly on the transparent electrode layer. The first collecting electrode 71 and the second collecting electrode 72 may each have one layer, or two or more layers.

In the present invention, it is preferable that the surface roughness of the second collecting electrode 72 is equal to the surface roughness of the first collecting electrode 71, or smaller than the surface roughness of the first collecting electrode 71. In other words, it is preferable to satisfy the requirement of Ra1≥Ra2 where Ra1 is the surface roughness of the first collecting electrode 71 and Ra2 is the surface roughness of the second collecting electrode 72. By satisfying the requirement of Ra1≥Ra2, adhesion between the first collecting electrode and the second collecting electrode can be increased. Particularly, it is preferable to satisfy the requirement of Ra1>Ra2 because adhesion can be further increased.

In this specification, the surface roughness Ra2 of the second collecting electrode means the surface roughness of the outermost layer of the second collecting electrode. For example, when the second collecting electrode includes the first layer of the second collecting electrode and the second layer of the second collecting electrode in this order from the photoelectric conversion section side, the second layer of the second collecting electrode has a surface roughness Ra2. It is preferable to satisfy the requirement of Ra1≥Ra2'≥Ra2, where Ra2' is the surface roughness of the first layer of the second collecting electrode. It is more preferable to satisfy the requirement of Ra1>Ra2', it is further preferable to satisfy the requirement of Ra2'>Ra2, and it is especially preferable to satisfy the requirement of Ra1>Ra2'>Ra2 for further increasing adhesion between the collecting electrodes.

In the present invention, the surface roughness Ra2 of the second collecting electrode is preferably 1.0 μm to 10.0 μm. When the surface roughness Ra2 is not less 1.0 μm or more and 10.0 μm or less, adhesion between the second collecting electrode and the wiring member can be increased, and therefore connectivity between the second collecting electrode and the wiring member can be improved. The surface roughness Ra1 of the first collecting electrode is preferably 1.0 μm or more. When the surface roughness Ra1 is in the above-mentioned range, adhesion with the insulating layer or second collecting electrode formed on the first collecting electrode can be increased, so that cell characteristics can be improved.

The back electrode 8 including the first back electrode 81 and the second back electrode 82 is formed on the transparent electrode layer 6b on the back side. As with the collecting electrode 7, it is preferable that the back electrode 8 is formed by a plating method, and it is preferable that the first back electrode 81 is formed as an electroconductive underlayer serving as an origination point, and the second back electrode 82 is formed as a plated layer on the electroconductive underlayer. The first back electrode 81 and the second back electrode 82 may each have one layer, or two or more layers.

As with the light-receiving side, it is preferable to satisfy the requirement of Ra'1≥Ra'2, and it is more preferable to satisfy the requirement of Ra'1>Ra'2 where Ra'1 is the surface roughness of the first back electrode and Ra'2 is the surface roughness of the second back electrode. When the second back electrode includes two layers: a first layer and a second layer, the second layer of the second back electrode has a surface roughness Ra'2. It is preferable to satisfy the requirement of Ra'2'>Ra'2, and it is more preferable to satisfy the requirement of Ra'1>Ra'2'≥Ra'2 where Ra'2' is the surface roughness of the first layer of the second back electrode.

The surface roughness Ra'2 of the second back electrode is preferably 1.0 μm to 10.0 μm.

The method for forming the first back electrode 81 is not particularly limited, and a physical vapor deposition method such as a sputtering method or a vacuum vapor deposition method, a printing method such as screen printing, or the like is applicable. For the first back electrode 81, it is desirable to use a material having a high reflectivity in a near-infrared to infrared range, and having high electroconductivity and chemical stability. Examples of the material satisfying these characteristics include silver and aluminum.

When the second back electrode 82 has a two-layer structure including the first layer 821 of the second back electrode and the second layer 822 of the second back electrode in this order from the photoelectric conversion section 50 side, it is desirable that a material capable of sufficiently suppressing the electric resistance be used as the first layer 821 of the second back electrode. Examples of the material having the above-mentioned characteristics include silver, copper and zinc. Although the method for depositing the first layer of the second back electrode is preferably a plating method, it may be a vacuum vapor deposition method or the like.

It is desirable that a material capable of suppressing oxidation and migration of the first layer of the second back electrode be used as the second layer 822 of the second back electrode. Examples of the material having the above-mentioned characteristics include tin, nickel, titanium and chromium. Although the method for depositing the second layer 822 of the second back electrode is preferably a plating method, it may be a sputtering method, a vacuum vapor deposition method or the like.

In the present invention, it is preferable that the outermost layer of the second collecting electrode and the outermost layer of the second back electrode are mainly composed of the same electroconductive material. Accordingly, the reliability of the solar cell module with respect to a temperature change can be improved. The term "mainly composed of" as described above means that the content is higher than 50% by weight, and the content is preferably 65% by weight or more, more preferably 80% by weight or more.

In the present invention, the outermost layer of the second collecting electrode on the light-receiving side and the outermost layer of the second back electrode on the back side may be mainly composed of the same electroconductive material. For example, when the second collecting electrode and the second back electrode each have one layer, the second collecting electrode and the second back electrode may be mainly composed of the same electroconductive material. When the second collecting electrode and the second back electrode each have two or more layers, at least the outermost layer of the second collecting electrode and the outermost layer of the second back electrode may be mainly composed of the same electroconductive material. For example, when the second collecting electrode and the second back electrode each have two layers, and include a first layer and a second layer in this order from the photoelectric conversion section side, the second layer of the second collecting electrode and the second layer of the second back electrode may be mainly composed of the same electroconductive material.

The outermost layer of the collecting electrode and the outermost layer of the back electrode are easily influenced by heat during connection of the electrode to the wiring member. Since the solar cell module is installed on a roof, ground or the like, it may be exposed to a temperature below the freezing point, or a high temperature of about 60 to 80 degrees, and it thus easily influenced by heat. The problem may arise that if there is a difference in expansion and shrinkage between the front surface and the back surface of the cell with respect to a temperature change, the wiring member is detached from the collecting electrode, or the cell is broken, leading to a reduction in power.

On the other hand, when the outermost layer of the collecting electrode on the light-receiving side and the outermost layer of the back electrode on the back side are mainly composed of the same electroconductive material, the reliability of the module can be secured. This may be because the thermal expansion coefficients of the materials of the front and back surfaces of the cell can be made equivalent to each other, so that detachment of the wiring member and cell breakage can be suppressed. Particularly, it is preferable that the second collecting electrode and the second back electrode include the same number of layers, and the $n^{th}$ layer of the second collecting electrode and the $n^{th}$ layer of the second back electrode (n is a natural number) are mainly composed of the same electroconductive material, because the thermal expansion coefficients on the light-receiving side and the back side can be made closer to each other. The $n^{th}$ layer and the $(n+1)^{th}$ layer are not required to be composed of the same electroconductive material. Further, it is preferable that the first collecting electrode and the first back electrode are mainly composed of the same electroconductive material.

Figure 7:
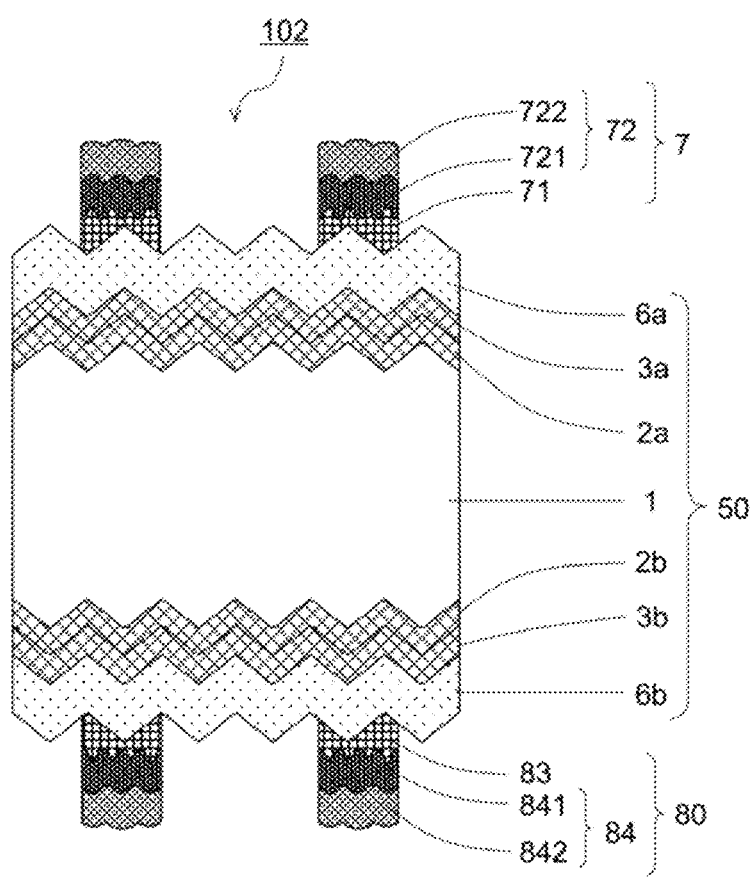
FIG. 7 is a schematic sectional view showing a heterojunction solar cell according to another embodiment.

FIG. 7 is a schematic sectional view of a heterojunction solar cell according to another embodiment. As in the solar cell 102 shown in FIG. 7, a back electrode 80 may be formed in a pattern shape by a screen printing method, a plating method or the like. When the back electrode 80 having the same shape as that of the collecting electrode 7 is formed using the same material and manufacturing method as those for the collecting electrode 7, adhesion between the collecting electrode and the wiring member and adhesion between the back electrode and the wiring member can be increased, and therefore connectivity between these electrodes and the wiring member can be improved, so that module characteristics are considered to be improved.

Hereinafter, preferred modes of manufacturing method of the collecting electrode and the back electrode will be described. First, as one mode of the manufacturing method of the collecting electrode, a method in which the second collecting electrode on the first collecting electrode is formed by a plating method will be described. In a heterojunction solar cell, a silicon layer, a transparent electrode layer, and so on are formed on a surface of a photoelectric conversion section, and therefore it is necessary that a region on the photoelectric conversion section where a collecting electrode is not formed (hereinafter, referred to as a collecting electrode-non-formed region) be covered with an insulating layer for protecting the region from a plating solution.

Particularly, when a solar cell including a transparent electrode layer as the outermost layer on a first principal surface of a photoelectric conversion section, such as a heterojunction solar cell, is used, it is necessary that a resist or an insulating layer be deposited on a first collecting electrode-non-formed region.

Examples of the method for covering the collecting electrode-non-formed region with an insulating layer etc. include the followings: a method in which an insulating layer having an opening section is formed on a surface of a photoelectric conversion section, a first collecting electrode is formed in the opening section, and a second collecting electrode is then formed on the first collecting electrode; a method in which a first collecting electrode is formed on almost the whole of a first principal surface of a photoelectric conversion section, a resist having an opening section is then formed, and a second collecting electrode is formed in the opening section; a method in which a first collecting electrode is formed, an insulating layer having an opening section is then formed on the first collecting electrode using a mask, and a second collecting electrode is formed in the opening section; and a method in which a first collecting electrode is formed, an insulating layer having an opening section is then formed so as to cover a first collecting electrode-formed region and a first collecting electrode-non-formed region, and a second collecting electrode is formed in the opening section. The same applies to a case where the second collecting electrode has a two-layer structure, and both the layers are formed by a plating method.

When the collecting electrode is formed by a plating method, it is preferable that an insulating layer having an opening section is formed between the first collecting electrode and the second collecting electrode, and the first collecting electrode and the second collecting electrode is conductively connected with each other via the opening section. Accordingly, adhesion between the first collecting electrode and the second collecting electrode may be increased.

The method for forming in the insulating layer an opening section conductively connecting the first collecting electrode and the second collecting electrode with each other is not particularly limited. Besides the aforementioned method using a resist or a mask, method such as laser irradiation, mechanical drilling or chemical etching may be employed. In one embodiment, a low-melting-point material is used as the electroconductive material in the first collecting electrode, and the low-melting-point material is thermally fluidized to form an opening section in an insulating layer formed thereon.

Examples of the method for forming an opening by thermal fluidization of a low-melting-point material in the first collecting electrode include the followings: a method in which the insulating layer is formed on the first collecting electrode containing a low-melting-point material, and heating (annealing) is carried out to a temperature equal to or higher than a thermal-fluidization onset temperature $T_1$ of the low-melting-point material to change the surface shape of the first collecting electrode, so that an opening (crack) is formed in the insulating layer formed on the first collecting electrode; and a method in which during the formation of the insulating layer on the first collecting electrode containing a low-melting-point material, heating is carried out to a temperature equal to or higher than the temperature $T_1$ to thermally fluidize the low-melting-point material, so that an opening is formed simultaneously with formation of the insulating layer.

A method for forming an opening in the insulating layer using thermal fluidization of a low-melting-point material in the first collecting electrode will be described below with reference to the drawings.

Figure 8:
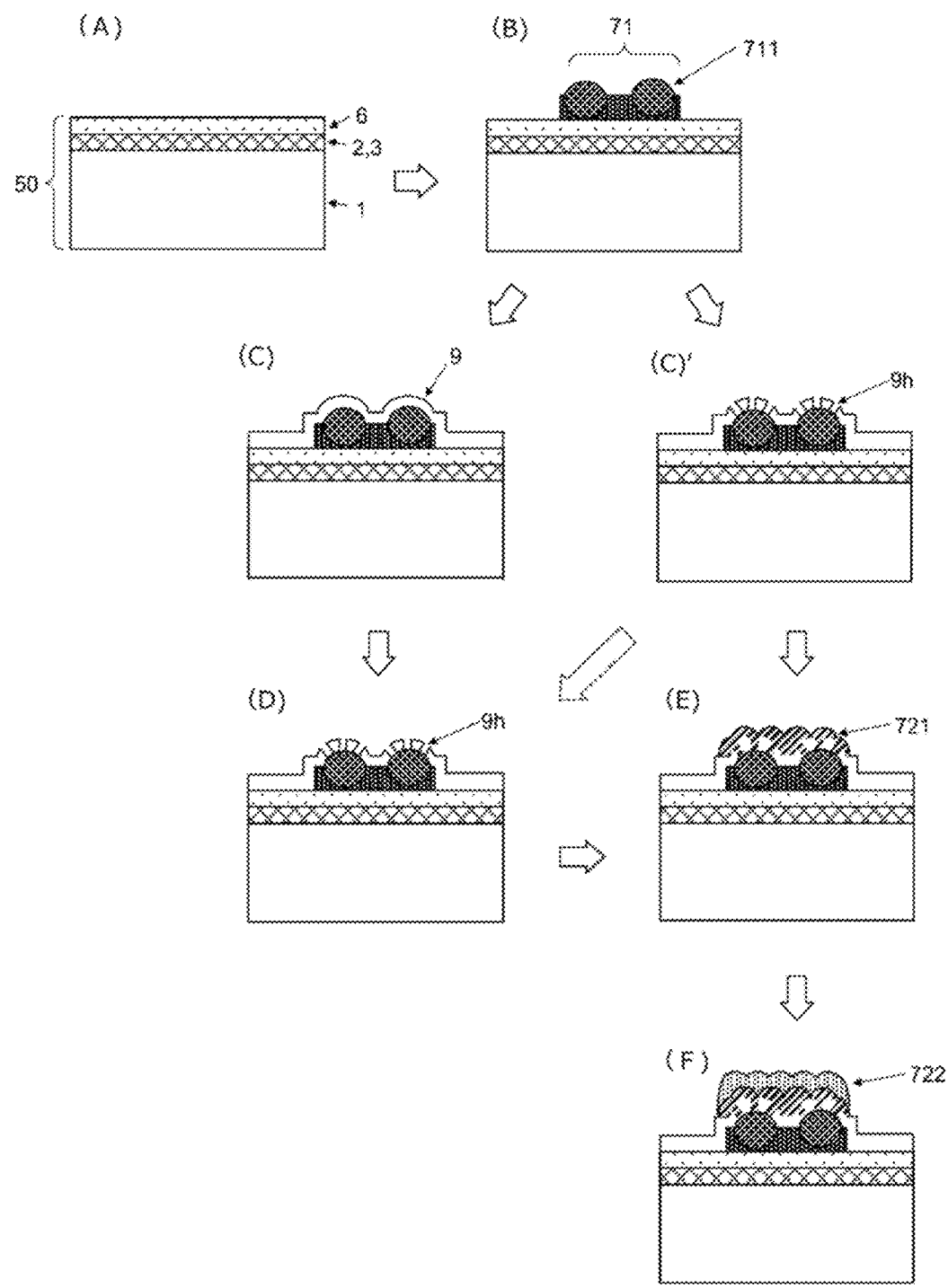
FIG. 8 is a process conceptual view showing one embodiment of a method for forming a collecting electrode.

FIG. 8 is a schematic procedural view showing one embodiment of a method for forming a collecting electrode 7 on a photoelectric conversion section 50 of a solar cell. In this embodiment, first, the photoelectric conversion section 50 is provided (a photoelectric conversion section providing step; FIG. 8 at (A)).

A first collecting electrode 71 containing a low-melting-point material 711 is formed on one principal surface of the photoelectric conversion section (a first collecting electrode forming step; FIG. 8 at (B)). An insulating layer 9 is formed on the first collecting electrode 71 (an insulating layer forming step, FIG. 8 at (C) or (C)'). In this embodiment, the insulating layer 9 is formed not only on the first collecting electrode 71, but also on a region which no first collecting electrode 71 is provided (first collecting electrode-non-formed region) in the photoelectric conversion section 50.

After the insulating layer 9 is formed as shown in FIG. 8 at (C), annealing treatment by heating (also referred to as heating treatment) is carried (an annealing step; FIG. 8 at (D)). The first collecting electrode 71 is heated to an annealing temperature Ta in the annealing treatment, so that the low-melting-point material is thermally fluidized to thereby change the surface shape, and accordingly the insulating layer 9 formed on the first collecting electrode 71 is deformed. Typically, deformation of the insulating layer 9 is a formation of an opening section 9*h* in the insulating layer. The opening section 9*h* is formed in the form of, for example, cracks.

The annealing treatment may be carried out during the insulating layer forming step. In this case, the opening section 9*h* is formed almost simultaneously with formation of the insulating layer as shown in FIG. 8 at (C)'. As indicated by the dashed line arrow in FIG. 8, an annealing treatment may be performed in the insulating layer forming step (FIG. 8 at (C)'), followed by further performing an annealing treatment (FIG. 8 at (D)).

After forming the opening section in the insulating layer 9 by the annealing treatment, a second collecting electrode 72 (first layer 721 and a second layer 722 of the second collecting electrode) is formed by a plating method (a plating step; FIG. 8 at (E) and FIG. 8 at (F)). In the case where the second collecting electrode is formed to have a two-layer structure, it is preferable to form the second layer 722 of the second collecting electrode by a plating method on the first layer 721 of the second collecting electrode as shown in FIG. 8 at (F). In FIG. 8 at (E), the first collecting electrode 71 is covered with the insulating layer 9, but the first collecting electrode 71 is exposed in a section where the opening section 9*h* is formed in the insulating layer 9. Therefore, the first collecting electrode 71 is exposed to plating solution, so that metal can be deposited at the opening section 9*h* serving as an origination point. In this embodiment, by the method above, the insulating layer 9 having an opening section is formed between the first collecting electrode 71 and the second collecting electrode 72. In the collecting electrode 7, a part of the second collecting electrode 72 is conductively connected with the first collecting electrode 71.

Here, the wording "a part of . . . is conductively connected with . . . " typically refers to a state in which a conductive connection is established by forming an opening section in the insulating layer and filling the opening section with a material of the second collecting electrode. In addition, a state is also included in which a part of the insulating layer has a very small thickness, i.e., only several nanometers (in other words, a region with the small thickness is locally formed), and resultantly the second collecting electrode 72 is conductively connected with the first collecting electrode 71. For example, when the electroconductive material of the first collecting electrode 71 is a metallic material such as aluminum, mention is made of a state in which a conductive connection is established between the first collecting electrode 71 and the second collecting electrode 72 via an oxide covering (corresponding to the insulating layer) formed on the surface of the first collecting electrode.

Figure 9:
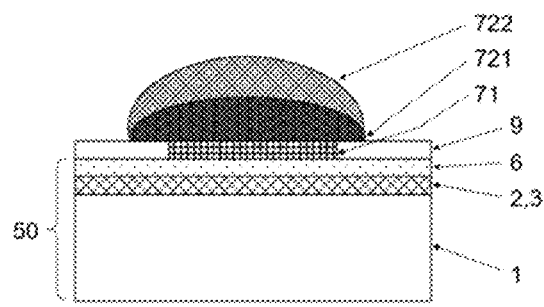
FIG. 9 is a conceptual view where an insulating layer is not formed on the first collecting electrode in the step (C) in FIG. 8.

In the case where the second collecting electrode is formed by a plating method, the insulating layer is formed before the plating. The insulating layer may be formed after the formation of the first collecting electrode and before the plating as shown in FIG. 8, or may be formed after the preparation of the photoelectric conversion section and before formation of the first collecting electrode as shown in FIG. 9. FIG. 9 shows an example in which a part corresponding to the first collecting electrode 71 is protected by a mask and the insulating layer 9 is formed on a portion other than the region where the first collecting electrode 71 is formed.

(First Collecting Electrode)

As the first collecting electrode 71, one having electroconductivity can be used. For example, when the second collecting electrode layer is formed by a plating method, it suffices that the first collecting electrode has such a level of electroconductivity that it can function as an electroconductive underlayer. In this specification, those having a volume resistivity of $10^{-2}$ Ω·cm or less are defined as being electroconductive. Those having a volume resistivity of $10^{2}$ Ω·cm or more are defined as insulating.

For example, when the collecting electrode has a structure of first collecting electrode/first layer of second collecting electrode/second layer of second collecting electrode, it may be able to appropriately set the surface roughness Ra2 in a desired range according to deposition conditions for the layers or the like as described later, and the surface roughness Ra2' of the first layer of the second collecting electrode on the first collecting electrode may be influenced by the surface roughness Ra1 of the first collecting electrode. Also, the surface roughness Ra2 of the second layer of the second collecting electrode may be influenced by the surface roughness Ra2'. Therefore, it is preferable to adjust the surface roughness Ra1 so that the surface roughness Ra2 is in a specific range. In this case, the surface roughness Ra1 is preferably 1.0 μm or more, more preferably 3.0 μm or more, further preferably 6.0 µm or more. The surface roughness Ra1 is preferably 10.0 µm or less, more preferably 8.0 µm or less.

When the surface roughness Ra1 of the first collecting electrode is in the above-mentioned range, the surface roughness Ra2 of the second layer of the second collecting electrode can be easily adjusted, and therefore adhesion between the second collecting electrode and the conductor of the wiring member can be increased. As a result, connectivity between the second collecting electrode and the conductor of the wiring member can be further improved, so that module performance and reliability can be further improved. The same applies to a case where the second collecting electrode has one layer.

The thickness of the first collecting electrode 71 is preferably 20 µm or less, more preferably 15 µm or less, in terms of costs. On the other hand, the thickness is preferably 0.5 µm or more, more preferably 1 µm or more, so that the line resistance of the first collecting electrode 71 falls within a desired range.

The electroconductive material contained in the first collecting electrode 71 is not particularly limited, and silver, copper, aluminum or the like can be used. In the case where the second collecting electrode is formed by a plating method and the insulating layer is formed between the first collecting electrode and the second collecting electrode, it is preferable, as mentioned above, that the electroconductive material include a low-melting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (the same as the definition for the softening point of glass).

The low-melting-point material is preferably thermally fluidized in the annealing treatment, thus causing a change in surface shape of the first collecting electrode 71. Therefore, the thermal-fluidization onset temperature $T_1$ of the low-melting-point material is preferably lower than an annealing temperature Ta. In the present invention, the annealing treatment is preferably carried out at the annealing temperature Ta that is lower than the heat-resistant temperature of the photoelectric conversion section 50. Therefore, the thermal-fluidization onset temperature $T_1$ of the low-melting-point material is preferably lower than the heat-resistant temperature of the photoelectric conversion section.

The heat-resistant temperature of the photoelectric conversion section is a temperature at which characteristics of a solar cell module prepared using a solar cell (also referred to as a "cell") or a solar cell including the photoelectric conversion section are irreversibly reduced. For example, in the heterojunction solar cell 101 shown in FIG. 6, the single-crystalline silicon substrate 1 that forms the photoelectric conversion section 50 hardly undergoes a change in characteristics even when heated to a high temperature of 500° C. or higher, but the transparent electrode layer 6 and amorphous silicon-based thin-films 2 and 3 may undergo thermal degradation, diffusion of dope impurities, or the like when heated to about 250° C., thus causing an irreversible reduction in the solar cell characteristics. Therefore, in the heterojunction solar cell, the first collecting electrode 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally fluidized in the step of forming the first collecting electrode, so that an amount of surface shape change of the first collecting electrode in the annealing treatment is increased to form the opening section 9h in the insulating layer 9 easily. For example, when the first collecting electrode is formed by coating or printing, heating may be carried out for drying. In this case, the thermal-fluidization onset temperature $T_1$ of the low-melting-point material is preferably higher than the temperature of heating for drying the first collecting electrode. Accordingly, the thermal-fluidization onset temperature $T_1$ of the low-melting-point material is preferably 80° C. or higher, more preferably 100° C. or higher.

The low-melting-point material is desired to be a metallic material that has electroconductivity. If the low-melting-point material is a metallic material, the resistance value of the first collecting electrode can be decreased, so that uniformity of the thickness of the second collecting electrode can be improved when the second collecting electrode is formed by electroplating. If the low-melting-point material is a metallic material, the contact resistance between the photoelectric conversion section 50 and the collecting electrode 7 can also be reduced.

As the low-melting-point material, a low-melting-point metallic material alone or an alloy thereof, or a mixture of a plurality of low-melting-point metallic materials can be suitably used. Examples of the low-melting-point metallic material include indium, bismuth, and gallium.

Besides the aforementioned low-melting-point material, the first collecting electrode 71 may contain, as the electroconductive material, high-melting-point material having thermal-fluidization onset temperature $T_2$ that is relatively higher than the thermal-fluidization onset temperature of the low-melting-point material. When the first collecting electrode 71 includes a high-melting-point material, a conductive connection can be efficiently established between the first collecting electrode and the second collecting electrode, so that conversion efficiency of the solar cell can be improved.

The thermal-fluidization onset temperature $T_2$ of the high-melting-point material is preferably higher than the annealing temperature Ta. That is, when the first collecting electrode 71 contains the low-melting-point material and the high-melting-point material, the thermal-fluidization onset temperature $T_1$ of the low-melting-point material, the thermal-fluidization onset temperature $T_2$ of the high-melting-point material and the annealing temperature Ta in the annealing treatment preferably satisfy $T_1<Ta<T_2$. The high-melting-point material may be an insulating material or an electroconductive material, but is preferably an electroconductive material in order to reduce the resistance of the first collecting electrode. As the electroconductive high-melting-point material, for example, a metallic material alone such as silver, aluminum or copper, or a plurality of metallic materials can be suitably used.

When the first collecting electrode 71 contains the low-melting-point material and the high-melting-point material, the content ratio thereof is appropriately adjusted from the viewpoints of suppression of disconnecting by coarsening of the low-melting-point material as described above, the electroconductivity of the first collecting electrode, ease of forming an opening section in the insulating layer (increase of the number of origination points for metal deposition in formation of the second collecting electrode), and so on.

When a particulate low-melting-point material such as metal particles is used as a material of the first collecting electrode 71, the particle size $D_L$ of the low-melting-point material is preferably no less than 1/20, more preferably no less than 1/10, of the thickness d of the first collecting electrode, so that a formation of an opening in the insulating layer by the annealing treatment is facilitated. The particle size $D_L$ of the low-melting-point material is preferably 0.25 µm or more, more preferably 0.5 µm or more. When the first collecting electrode 71 is formed by a printing method such as screen printing, the particle size of particles can be appropriately set according to, for example, the mesh size of a screen plate.

Figure 10:
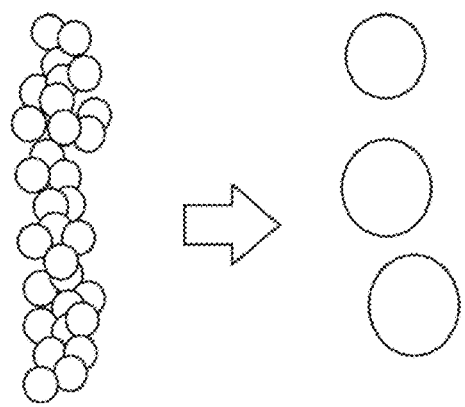
FIG. 10 is a conceptual view showing one example of a shape change of a low-melting-point material during heating.

Besides using the combination of the low-melting-point material and the high-melting-point material described above as the material of the first electrically conductive layer 71, conversion efficiency may also be improved by adjusting the size of materials (e.g., particle size) and the like to suppress the disconnecting of the first collecting electrode due to heating in the annealing treatment. For example, even a material having a high melting point, e.g., silver, copper or gold, in the form of fine particles having a particle size of 1 µm or less, undergoes sintering-necking (fusion of fine particles) at a temperature lower than the melting point, i.e., about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first collecting electrode can be changed to form an opening section in the insulating layer 9. Even when fine particles are heated to the sintering-necking onset temperature $T_1'$ or higher, the fine particles retain a solid phase state at any temperature that is lower than a melting point $T_2'$, and therefore disconnecting by coarsening of the material as shown in FIG. 10 hardly occurs. In this respect, it can be said that the material that undergoes sintering-necking, such as metal fine particles, has an aspect of the "high-melting-point material" as well while being the "low-melting-point material" in the present invention.

Figure 11A:
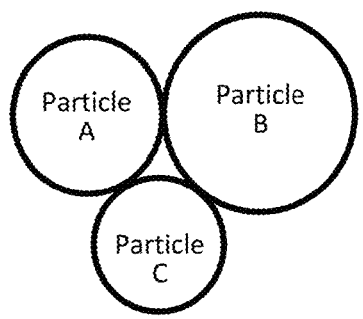
FIGS. 11A-11C are conceptual views for explaining a shape change and necking of a low-melting-point material powder during heating.
Figure 11B:
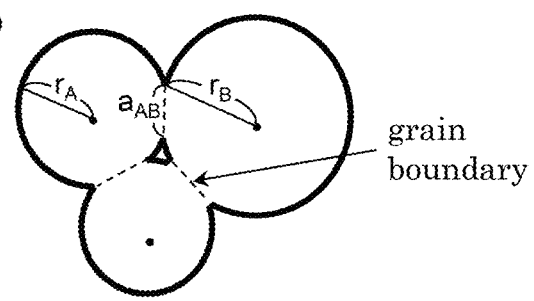
Figure 11C:
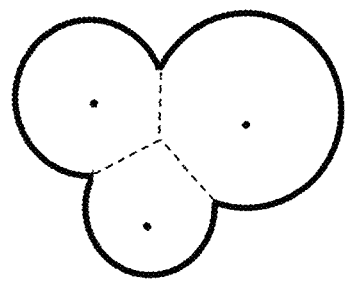

In the material that undergoes sintering-necking, the sintering-necking onset temperature $T_1'$ can be defined as being equal to a thermal-fluidization onset temperature $T_1$. FIGS. 11A to 11C are views for explaining the sintering-necking onset temperature. FIG. 11A is a plan view schematically showing particles before sintering. Particles contact one another at points because they are particles before sintering. FIGS. 11B and 11C are sectional views each schematically showing a state when particles after the onset of sintering are cut along a cross section that passes through the center of each particle. FIG. 11B shows particles after the onset of sintering (initial sintering stage), and FIG. 11C shows a state in which the particles of FIG. 11B are further sintered. In FIG. 11B, the grain boundary between a particle A (radius: $r_A$) and a particle B (radius: $r_B$) is shown by a dotted line segment (length: $a_{AB}$).

Figure 12A:
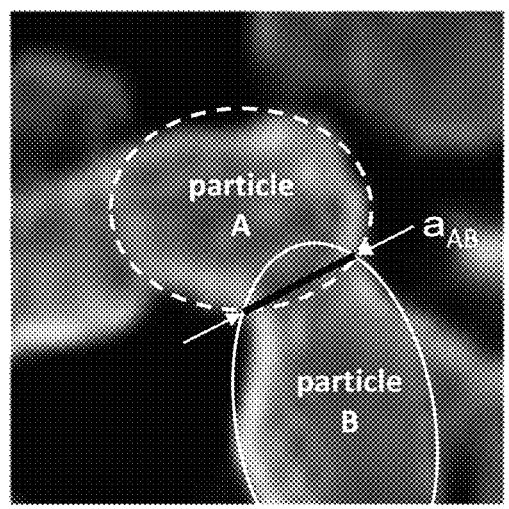
FIGS. 12A-12B are SEM photographs of metal fine particles in which sintering-necking occurs.
Figure 12B:
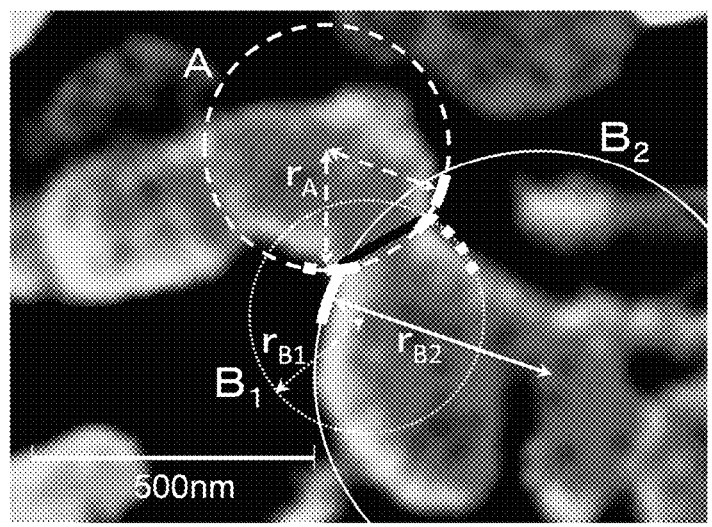

The sintering-necking onset temperature $T_1'$ is defined by a temperature at which the ratio of the length $a_{AB}$ of the grain boundary to max $(r_A, r_B)$, that is the larger of $r_A$ and $r_B$, $a_{AB}/\max(r_A, r_B)$, is 0.1 or more. That is, the temperature, at which $a_{AB}/\max(r_A, r_B)$ of at least a pair of particles is 0.1 or more, is referred to as a sintering-necking onset temperature. In FIGS. 11A to 11C, particles are shown as being spherical for simplification, but when particles are not spherical, the curvature radius of a particle near the grain boundary is considered as the radius of the particle. When the curvature radius of the particle near the grain boundary varies depending on the location, the largest curvature radius among measurement points is considered as the radius of the particle. For example, as shown in FIG. 12A, a grain boundary having a length of $a_{AB}$ is formed between a pair of fine particles A and B that undergo sintering. In this case, the shape of the particle A near the grain boundary is approximated by the arc of an imaginary circle A shown in a dashed line. On the other hand, for the shape of the particle B near the grain boundary, one is approximated by the arc of an imaginary circle $B_1$ shown in a dotted line, and the other is approximated by the arc of an imaginary circle $B_2$ shown in a solid line. As shown in FIG. 12B, $r_{B2}$ is larger than $r_{B1}$, and therefore $r_{B2}$ is considered as the radius m of the particle B. The aforementioned imaginary circle can be determined by a method in which a boundary is defined by monochromatic binarization processing of an observed image at the cross section or the surface, and central coordinates and a radius are calculated by a least square method based on the coordinates of the boundary near the grain boundary. When it is difficult to accurately measure the sintering-necking onset temperature based on the aforementioned definition, a first collecting electrode containing fine particles is formed, and a temperature at which an opening section (a crack) is formed in the insulating layer by heating can be considered as a sintering-necking onset temperature. When the heating is carried out during the formation of the insulating layer, a temperature at which an opening section (a crack) is formed in the heating during formation of the insulating layer can be considered as a sintering-necking onset temperature.

As the electroconductive material of the first collecting electrode, one which does not contain the low-melting-point material may be used. For example, as the electroconductive material of the first collecting electrode, one containing only the high-melting-point material may be used. Even when the first collecting electrode does not contain a low-melting-point material, an opening can be formed in the insulating layer on the first collecting electrode by, for example, a method in which an insulating layer is deposited so as to cover the first collecting electrode, and an opening section is then formed in the insulating layer separately as described above.

The first collecting electrode forming material may include an insulating material besides the aforementioned electroconductive material (e.g., low-melting-point material and/or high-melting-point material). For the first collecting electrode forming material including an insulating material, a paste or the like containing a binder resin or the like can be suitably used, besides the aforementioned low-melting-point material (and the high-melting-point material). For sufficiently improving the electroconductivity of the first collecting electrode formed by a screen printing method, it is desirable to cure the first collecting electrode by a heating treatment. Therefore, for the binder resin contained in the paste, a material that can be cured at the aforementioned drying temperature is preferably used, and an epoxy-based resin, a phenol-based resin, an acrylic resin and the like are applicable.

The first collecting electrode 71 can be prepared by a known technique such as an inkjet method, a screen printing method, a conductor wire bonding method, a spray method, a vacuum vapor deposition method, or a sputtering method. The first collecting electrode 71 is preferably patterned in a specific shape such as a comb-like pattern. For formation of the patterned first collecting electrode, the screen printing method is suitable to increase productivity. For the screen printing method, a method is suitably used in which a collecting electrode pattern is printed using a printing paste containing an electroconductive material, and a screen plate having an opening pattern corresponding to the pattern shape of the collecting electrode.

When a material containing a solvent is used as a printing paste, a drying step for removing the solvent is required. As described previously, the drying temperature in this case is preferably lower than the heat-resistant temperature of the photoelectric conversion section. For example, when the photoelectric conversion section includes a transparent electrode, an amorphous silicon-based thin-film, or the like, the drying temperature is preferably 250° C. or lower, and more preferably 200° C. or lower. When a printing paste including a low-melting-point material, the drying temperature is the drying temperature is preferably lower than the thermal-fluidization onset temperature $T_1$ of the low-melting-point material. The drying time can be appropriately set at, for example, about 5 minutes to 1 hour.

The surface roughness Ra1 can be easily set in a specific range by appropriately adjusting the type, particle size, content and so on of an electroconductive material contained in the first collecting electrode. Particularly, when a low-melting-point material is used as the electroconductive material, the surface roughness Ra1 can be easily set in the above-mentioned range by appropriately adjusting the particle size, content and so on of the low-melting-point material. When the surface roughness Ra1 is in a specific range, adhesion with the second collecting electrode formed on the first collecting electrode can be increased.

For example, when a printing paste is used for formation of the first collecting electrode, the viscosity of the printing paste is preferably 20 Pa·s or more and 500 Pa·s or less. When the viscosity of the printing paste is in the aforementioned range, Ra1 of the first collecting electrode can be more easily set in a specific range. When the viscosity of the printing paste is 20 Pa·s or more, a ratio of the thickness to the line width (aspect ratio) in the first collecting electrode can be increased, so that a light-shielding loss or line resistance can be reduced. The viscosity of the printing paste is more preferably 50 Pa·s or more, especially preferably 80 Pa·s or more. The viscosity of the printing paste is preferably 500 Pa·s or less, more preferably 400 Pa·s or less, especially preferably 300 Pa·s or less for improving contact with the transparent collecting electrode.

The first collecting electrode may be composed of a plurality of layers. The first collecting electrode may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first collecting electrode is made still less resistive by forming a layered structure of a layer with low-melting-point material and a layer with high-melting-point material.

(Insulating Layer)

When the second collecting electrode 72 is formed by a plating method, it is preferable, as described above, that the insulating layer 9 is formed on the first collecting electrode 71. Here, when the first collecting electrode 71 is formed in a predetermined pattern (e.g., comb shape), a first collecting electrode-formed region where the first collecting electrode 71 is formed and a first collecting electrode-non-formed region where the first collecting electrode 71 is not formed exist on a surface of the photoelectric conversion section 50.

The insulating layer 9 is formed on at least the first collecting electrode-non-formed region. Preferably, the insulating layer 9 is formed on the whole surface of the first collecting electrode-non-formed region. When the insulating layer is formed on the whole surface of the first collecting electrode-non-formed region, the photoelectric conversion section and the transparent electrode layer can be chemically and electrically protected from a plating solution in formation of the second collecting electrode by a plating method. For example, when a transparent electrode layer is formed on a surface of the photoelectric conversion section 50 as in a heterojunction solar cell, an insulating layer is formed on the surface of the transparent electrode layer to inhibit contact between the transparent electrode layer and a plating solution, so that deposition of the metal layer (second collecting electrode) on the transparent electrode layer can be prevented.

In the case where the insulating layer 9 is formed after formation of the first collecting electrode 71, it is preferable that the insulating layer 9 is also formed on the first collecting electrode-formed region. When the insulating layer is formed so as to cover the first collecting electrode, the photoelectric conversion section can be protected from a plating solution. It is more preferable that the insulating layer is formed on the whole of the first collecting electrode-formed region and the first collecting electrode-non-formed region from the viewpoint of productivity.

Generally, a thinned collecting electrode is preferably used for reducing a shading loss. In this case, it is desired to further increase adhesion between the first collecting electrode and the second collecting electrode.

It is considered that by setting the surface roughness Ra1 of the first collecting electrode in a specific range when the insulating layer is formed between the first collecting electrode and the second collecting electrode, an irregularity structure can be easily formed on a surface of the insulating layer on the second collecting electrode side, so that adhesion with the second collecting electrode formed on the insulating layer is increased. As a result, an effect of suppressing detachment between the first collecting electrode and the second collecting electrode can be expected even when the collecting electrode is thinned. Accordingly, improvement of the yield (effect by suppression of detachment), reduction of the shading loss (effect by thinning) and so on can be expected.

As the material of the insulating layer 9, an electrically insulating material is used. It is desirable that the insulating layer 9 be a material having chemical stability against a plating solution. By using a material having high chemical stability against a plating solution, the insulating layer is hardly dissolved in a plating step during formation of the second collecting electrode, so that damage to the surface of the photoelectric conversion section is hindered. When the insulating layer 9 is formed on the first collecting electrode-non-formed region before the plating step, the insulating layer 9 preferably has high adhesive strength with the photoelectric conversion section 50. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light-incident side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second collecting electrode. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

Although the material of the insulating layer may be an inorganic insulating material or an organic insulating material, inorganic insulating material is preferable. As the inorganic insulating material, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate, or the like is suitably used in view of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, or the like is preferable from the viewpoints of electrical characteristics, adhesiveness with the transparent electrode layer, and so on, and silicon oxide, silicon nitride, or the like is especially suitably used to adjust the refractive index appropriately. These inorganic materials are not limited to those having a stoichiometric composition, and may include oxygen deficiencies. As the organic insulating material, a material such as polyester, an ethylene-vinyl acetate copolymer, acrylic, epoxy, or polyurethane can be used.

The thickness of the insulating layer 9 may be set appropriately, according to the material of the insulating layer and method of formation thereof. When the first collecting electrode including the low-melting-point material is used and the insulating layer is also formed on the first collecting electrode, the thickness of the insulating layer 9 is preferably so thin that an opening section can be formed in the insulating layer by stress or the like at the interface, which occurs as the surface shape of the first collecting electrode is changed in the annealing treatment. Accordingly, the thickness of the insulating layer 9 is preferably 1000 nm or less, more preferably 500 nm or less. By appropriately setting the optical characteristics and thickness of the insulating layer 9 in a first collecting electrode-non-formed region, light reflection characteristics are improved, and the amount of light introduced into the solar cell is increased, so that conversion efficiency can be further improved. In order to obtain this effect, the refractive index of the insulating layer 9 is preferably lower than the refractive index of the surface of the photoelectric conversion section 50. In order to impart suitable anti-reflection characteristics to the insulating layer 9, the thickness is preferably set within a range of 30 nm to 250 nm, and more preferably set within a range of 50 nm to 250 nm. When the insulating layer is also formed on the first collecting electrode, the thickness of the insulating layer on the first collecting electrode-formed region and the thickness of the insulating layer on the first collecting electrode-non-formed region may be mutually different. For example, the thickness of the insulating layer may be set so as to facilitate a formation of an opening section by the annealing treatment as to the first collecting electrode-formed region, and the thickness of the insulating layer may be set so as to have an optical thickness with appropriate anti-reflection characteristics as to the first collecting electrode-non-formed region.

On the other hand, when an inorganic insulating material is applied in the form of a paste or the like to form an insulating layer, the thickness of the insulating layer is preferably 1 μm or more, more preferably 3 μm or more so that recessed portions and projected portions in the texture are filled. The thickness of the insulating layer is preferably 15 μm or less, more preferably 10 μm or less so that it does not exceed the height of the first collecting electrode.

When a transparent electrode layer (the refractive index of which is generally about 1.9 to 2.1) is provided on the surface of the photoelectric conversion section 50 as in the heterojunction solar cell, the refractive index of the insulating layer is preferably an intermediate value between the refractive index of air (1.0) and the refractive index of the transparent electrode layer to enhance an anti-reflection effect at the interfaces, thereby increasing an amount of light introduced into the solar cell. When the solar cells are sealed to be modularized, the refractive index of the insulating layer is preferably an intermediate value between the refractive index of a sealing material and the refractive index of the transparent electrode layer. Accordingly, the refractive index of the insulating layer 9 is, for example, preferably 1.4 to 1.9, more preferably 1.5 to 1.8, further preferably 1.55 to 1.75. When the refractive index falls within the above-mentioned range, liquid repellent against a plating solution can be suppressed and thus thickness, quality, etc. of a plated layer are considered to be easily adjusted.

The refractive index of the insulating layer can be adjusted to fall within a desired range according to the material, composition, and the like of the insulating layer. For example, in the case of silicon oxide, the refractive index is increased by decreasing the oxygen content. Unless otherwise specified, the refractive index in this specification is a refractive index to light having a wavelength of 550 nm and a value measured by spectroscopic ellipsometry. The optical thickness (refractive index×thickness) of the insulating layer is preferably set according to the refractive index of the insulating layer so that anti-reflection characteristics are improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

When the photoelectric conversion section 50 has on its surface a textured structure (uneven structure) as in the heterojunction solar cell shown in FIG. 6, the insulating layer is preferably formed by the plasma-enhanced CVD method or the screen printing method so that a film may be formed with high accuracy even at recessed and raised portions of the texture. By using an insulating layer having high density, damage to the transparent electrode layer during a plating treatment can be reduced, and also deposition of a metal onto the transparent electrode layer can be prevented. Thus, the insulating layer having high density can function as a barrier layer to water, oxygen, and the like for a layer within the photoelectric conversion section 50, like the silicon-based thin-film 3a in the heterojunction solar cell in FIG. 6, so that an effect of improving long-term reliability of the solar cell can also be expected.

When the insulating layer 9 is formed between the first collecting electrode 71 and the second collecting electrode 72, this insulating layer 9 may contribute to improvement of adhesive strength between the first collecting electrode 71 and the second collecting electrode 72. For example, when a copper layer as the second collecting electrode is formed on a silver layer as the first collecting electrode by a plating method, adhesive strength between the silver layer and the copper layer is low. In contrast, the adhesive strength of the second collecting electrode is increased to improve the reliability of the solar cell as a result of formation of the copper layer on the insulating layer formed of silicon oxide or the like.

As described above, in the case where the first collecting electrode 71 contains a low-melting-point material, for example, the annealing treatment is performed after the insulating layer 9 is formed on the first collecting electrode 71 and before the second collecting electrode 72 is formed. In the annealing treatment, the first collecting electrode 71 is heated to a temperature higher than the thermal-fluidization onset temperature $T_1$ of the low-melting-point material, and the low-melting-point material is fluidized, so that the surface shape of the first collecting electrode is changed. In association with this change, the opening section 9h is formed in the insulating layer 9 on the first collecting electrode. Therefore, in the subsequent plating step, a part of the surface of the first collecting electrode 71 is exposed to a plating solution for conducting electricity, thus making it possible to deposit a metal on the conducting part as an origination point as shown in FIG. 8 at (E).

The annealing temperature (heating temperature) Ta in the annealing treatment is preferably higher than the thermal-fluidization onset temperature $T_1$ of the low-melting-point material, i.e., $T_1<Ta$. The annealing temperature Ta can be appropriately set according to the composition and content of the material of the first collecting electrode, and so on. The annealing temperature Ta is preferably lower than the heat-resistant temperature of the photoelectric conversion section 50 as described above.

The method for forming an opening section on an insulating layer is not limited to a method in which an annealing treatment is performed after formation of the insulating layer. As shown in FIG. 8 at (C)', an opening section may be formed almost simultaneously with formation of the insulating layer by heating the substrate in formation of the insulating layer. When an annealing treatment is performed in the insulating layer forming step, an opening section can be formed in the insulating layer by appropriately adjusting the material and composition of the insulating layer and deposition conditions (deposition method, substrate temperature, type and introduction amount of introduced gas, deposition pressure, power density, and the like).

(Second Collecting Electrode)

It is preferable that the second collecting electrode 72 is formed by a plating method on the first collecting electrode 71 serving as an electroconductive underlayer. As shown in FIG. 8, the insulating layer 9 provided with an opening section 9h is formed, and the second collecting electrode 72 is thereafter formed on the insulating layer 9 on the first collecting electrode-formed region.

The second collecting electrode can be formed by either of an electroless plating method and an electroplating method. The electroplating method is suitably used in order to increase productivity. In the electroplating method, the metal deposition rate can be increased, so that the second collecting electrode can be formed in a short time.

The metal deposited as the second collecting electrode is not particularly limited as long as it is a material that can be formed by a plating method, and for example, copper, nickel, tin, aluminum, chromium, silver, gold, zinc, lead, palladium, or the like, or a mixture thereof can be used.

Preferably, the second collecting electrode has a surface roughness Ra2 of 1.0 µm to 10.0 µm. When the surface roughness Ra2 of the second collecting electrode is in the above-mentioned range, adhesion between the conductor of the wiring member and the collecting electrode in modularization of the solar cell. As a result, connectivity between the conductor of the wiring member and the collecting electrode can be improved, so that module initial performance and reliability can be improved. The surface roughness Ra2 is more preferably 1.5 µm or more, further preferably 3.0 µm or more. For improving connectivity between the conductor of the wiring member and the collecting electrode, the surface roughness Ra2 is more preferably 9.0 µm or less, further preferably 5.0 µm or less.

Examples of the method for adjusting the surface roughness Ra2 to fall within the above-mentioned range include the following: a method in which an irregular shape on a surface of a layer provided under the second collecting electrode is adjusted; a method in which conditions for formation of the second collecting electrode are adjusted; and a mechanical polishing method. Among them, a method in which an irregular shape on a surface of a layer provided under the second collecting electrode is adjusted is preferable, and a method in which an irregular shape on a surface of a layer provided under the second collecting electrode is adjusted and conditions for formation of the second collecting electrode are adjusted is more preferable because damage to the solar cell can be further suppressed.

Examples of the method for adjusting surface irregularities of a layer provided under the second collecting electrode include a method in which the surface roughness Ra1 of the first collecting electrode is adjusted. When an insulating layer is provided between the first collecting electrode and the second collecting electrode, the surface roughness Ra2 can be adjusted to fall within the above-mentioned range by adjusting the surface roughness, thickness, deposition conditions, contact angle with water, and so on for the insulating layer formed on the first collecting electrode.

When the second collecting electrode is formed by a plating method, examples of the method for adjusting conditions for formation of the second collecting electrode include a method in which conditions such as the temperature of a plating solution, the plating time and the current during plating, and the thickness is controlled.

When the second collecting electrode has a two-layer structure of a first layer and a second layer, the surface roughness Ra2 of the second collecting electrode (surface roughness of the second layer of the second collecting electrode) can be appropriately adjusted by adjusting the surface shape of the first layer of the second collecting electrode as in the case of the first collecting electrode described above.

As described above, the surface roughness Ra2 of the second collecting electrode is influenced by the surface roughness Ra1 of the first collecting electrode provided under the second collecting electrode, and the surface roughness of the insulating layer. Therefore, by adjusting the surface roughness Ra1, the surface roughness of the insulating layer and the surface roughness Ra2 can be each adjusted to fall within a specific range. As described above, the surface roughness Ra1 is preferably 1.0 μm to 10.0 μm, more preferably 3.0 μm to 8.0 μm, further preferably 6.0 μm to 8.0 μm.

In the solar cell module 200, the conductor 342 of the wiring member 34 and the collecting electrode 7 of the solar cell 100 are connected to each other to connect the wiring member 34 and the solar cell 100 to each other as shown in FIGS. 1 to 4. As shown in FIG. 2, the collecting electrode 7 on the light-receiving side is formed in a pattern shape for capturing light. If the surface roughness of the collecting electrode is excessively large or excessively small, a connection failure easily occurs in connection of the wiring member onto the collecting electrode in a pattern shape as described above, and therefore the problem arises that the initial performance of the solar cell module is deteriorated, or reliability is deteriorated. On the other hand, in the present invention, a collecting electrode having a specific surface roughness is formed, and thus adhesion between the conductor of the wiring member and the collecting electrode in preparation of the solar cell module can be increased. As a result, connectivity between the conductor of the wiring member and the collecting electrode can be improved, so that module initial performance and reliability can be improved.

Electric current principally passes through the second collecting electrode during operation (electricity generation) of the solar cell. Thus, the line resistance of the second collecting electrode is preferably as low as possible so as to suppress the resistance loss in the second collecting electrode. Specifically, the line resistance of the second collecting electrode is preferably 1 Ω/cm or less, more preferably 0.5 Ω/cm or less. On the other hand, it suffices that the line resistance of the first collecting electrode is so low that the layer can function as an underlayer at the time of electroplating, with an example thereof being 5 Ω/cm or less.

When the second collecting electrode is formed by a plating method, acidic copper plating solution having known composition, which has copper sulfate, sulfuric acid, and water as main components, can be used as the plating solution. By causing a current of 0.1 to 10 A/dm² to pass through the plating solution, a metal as the second collecting electrode can be deposited. The suitable plating time is appropriately set according to the area of a collecting electrode, the current density, cathode current efficiency, desired thickness, and so on.

By changing conditions such as the temperature of a plating solution, the current density and the plating time, the metal deposition rate, film quality or the like can be adjusted, and surface irregularities of the second collecting electrode can be adjusted. For example, when the temperature of a plating solution is 20 to 40° C., the current density is 3 to 6 A/dm², and the plating time is about 3 to 6 minutes, the film quality of a metal that is deposited can be adjusted, and the surface roughness Ra2 of the second collecting electrode can be easily adjusted to fall within a specific range.

When the second collecting electrode has two or more layers, it is preferable that at least one layer is formed by a plating method, and it is more preferable that all the layers of the second collecting electrode are formed by a plating method. For example, it is preferable that the first layer of the second collecting electrode is formed by a plating method, and the second layer of the second collecting electrode is formed by a plating method, and it is more preferable that the first layer and the second layer of the second collecting electrode are formed by an electroplating method. In this case, it is preferable that a plating solution used for forming the first layer is an acidic copper plating solution, a plating solution used for forming the second layer is another plating solution, for example an aqueous solution containing tin ions, and an alkylsulfonic acid mainly composed of methanesulfonic acid. It is preferable to supply tin ions from a tin alkylsulfonate such as tin methanesulfonate.

A metal as the second layer of the second collecting electrode can be deposited by feeding a current of 0.1 to 10 A/dm² through a plating solution mainly composed of tin ions, an alkylsulfonic acid mainly composed of methanesulfonic acid, additives and water and having a known composition. A suitable plating time is appropriately set according to the area of the collecting electrode, the current density, the cathode current efficiency, the set thickness and so on.

By changing conditions such as the temperature of a plating solution, the current density and the plating time, the metal deposition rate, film quality or the like can be adjusted, and thus surface irregularities of the second layer of the second collecting electrode can be adjusted. For example, when the temperature of a plating solution for forming the second layer of the second collecting electrode is 20 to 40° C., the current is 0.5 to 4 A/dm², and the plating time is about 1 to 6 minutes, the film quality of a metal that is deposited can be adjusted, thereby the surface roughness Ra2 of the second layer of the second collecting electrode can be easily adjusted to fall within a specific range, It is preferable that after carrying out the plating step, a plating solution removing step be provided to remove a plating solution remaining on the surface of the substrate. By providing the plating solution removing step, a metal that can be deposited at a part, other than at the opening section 9h of the insulating layer 9 formed in the annealing treatment, as an origination point can be removed. Examples of the metal deposited at a part other than at the opening section 9h as an origination point include those deposited at a pinhole in the insulating layer 9 as an origination point. As a result of removing such a metal by the plating solution removing step, the shading loss is reduced, so that solar cell characteristics can be further improved.

An insulating layer removing step may be carried out after the plating step. In particular, when a material having large optical absorption is used as the insulating layer, the insulating layer removing step is preferably carried out for suppressing reduction of solar cell characteristics by the optical absorption of the insulating layer. The method for removing the insulating layer is appropriately selected according to the characteristics of the insulating layer material. When a material having small optical absorption is used as the insulating layer, it is not necessary to carry out the insulating layer removing step.

(Back Electrode)

As described above, examples of the method for depositing the first back electrode 81 include physical vapor deposition methods such as a sputtering method and a vacuum vapor deposition method, and printing methods such as screen printing. Examples of the method for depositing the second back electrode 82 include a plating method and a vapor deposition method. When the second back electrode 82 includes two layers: the first layer 821 and the second layer 822, examples of the method for depositing the first layer 821 include a plating method and a vapor deposition method, and the method for depositing the second layer 822 include a sputtering method, a vacuum vapor deposition method and a plating method.

When the second back electrode has one layer, combination of the materials of first back electrode/second back electrode is preferably silver/copper or aluminum/copper, and when the second back electrode has two layers, combination of the materials of the first back electrode/first layer of second back electrode/second layer of second back electrode is preferably silver/copper/nickel, silver/copper/tin, silver/copper/silver, aluminum/copper/nickel or aluminum/copper/tin, more preferably silver/copper/tin.

For example, when the back electrode is deposited on the whole surface on the back side, the thickness of the back electrode is preferably 1200 to 6000 nm for reducing the resistance. For example, in the case where the back electrode is first collecting electrode/first layer of second collecting electrode/second layer of second collecting electrode, and materials thereof are silver/copper/tin, respectively, the thickness of the first collecting electrode is preferably 8 to 100 nm, the thickness of the first layer of the second collecting electrode is preferably 200 to 1000 nm, and the thickness of the second layer of the second collecting electrode is 1000 nm to 5000 nm.

In the present invention, it is preferable that the outermost layer of the second collecting electrode on the light-receiving side and the outermost layer of the second back electrode on the back side is mainly composed of the same electroconductive material. When the second collecting electrode and the second back electrode each include a plurality of layers, at least the outermost layer on the light-receiving side and the outermost layer on the back side may be mainly composed of the same electroconductive material.

It is necessary to connect the wiring member and the solar cell to each other by compression-bonding under heating for connecting them in modularization of the solar cell. When the collecting electrode and the back electrode have considerably different thermal expansion coefficients, cell breakage occurs after sealing due to cell warpage after connection. The problem arises that the wiring member is detached from the collecting electrode and the back electrode with respect to a temperature change, leading to deterioration of module performance. Particularly, a method in which the conductor of the wiring member and the collecting electrode, or the conductor of the wiring member and the back electrode are brought into contact with each other by soldering etc. markedly has the above-mentioned problem because it is necessary to connect the wiring member and the electrode to each other at a higher temperature as compared to a connection method using an electroconductive adhesive. On the other hand, when the outermost layer of the second collecting electrode on the light-receiving side and the outermost layer of the second back electrode on the back side are mainly composed of the same electroconductive material as in the present invention, cell warpage after connection and detachment of the wiring member with respect to a temperature change can be prevented, so that deterioration of module performance can be suppressed.

Particularly, the electroconductive material of the second collecting electrode and the second back electrode is preferably the same as the material of the conductor of the wiring member. In this case, adhesion between the collecting electrode and the wiring member, and adhesion between the back electrode and the wiring member are further increased, so that detachment of the wiring member from the collecting electrode and the back electrode can be prevented. When the second collecting electrode and the second back electrode each include a plurality of layers, the electroconductive material of the outermost layer may be the same as the material of the conductor of the wiring member.

When the back electrode is formed so as to cover almost the whole of the back surface of the photoelectric conversion section, and the wiring member and the back electrode are directly connected to each other, the thermally melted conductor of the wiring member is extended beyond the width of the wiring member. Therefore, the conductor is considered to be stably attached to the back electrode due to an increase of the contact area. When the wiring member and the back electrode are connected to each other via an electroconductive adhesive, the electroconductive adhesive may be stably attached to the back electrode because the electroconductive adhesive is thermocompression-bonding and extended. On the other hand, when the back electrode is in a pattern shape, it is preferable that, as with the collecting electrode, the surface roughness of the back electrode is adjusted to fall within a specific range.

In the present invention, the outermost layer of the second collecting electrode and the outermost layer of the second back electrode may be deposited by different methods as long as these outermost layers are mainly composed of the same electroconductive material. For example, a silver paste is applied as the first collecting electrode on the light-receiving side by screen printing, silver is deposited as the first back electrode by a sputtering method, copper is then deposited as the second collecting electrode on the light-receiving side by a plating method, and copper is deposited as the second back electrode by a sputtering method. Particularly, it is preferable that the outermost layer of the second collecting electrode and the outermost layer of the second back electrode are formed by the same production method because the manufacturing process can be simplified, and the thermal expansion coefficient of the outermost layer of the second collecting electrode and the thermal expansion coefficient of the outermost layer of the second back electrode can be made close to each other.

As described above, the second collecting electrode and the second back electrode are each connected to the wiring member in modularization of the solar cell, and are therefore easily influenced by thermal expansion at the time of connecting the wiring member, and shrinkage by cooling after connection. When the outermost layer of the second collecting electrode and the outermost layer of the second back electrode are formed by the same production method, the thicknesses of both the outermost layers can be easily equivalent to each other, and accordingly, the thermal expansion coefficients of these outermost layers can be close to each other. As a result, detachment of the wiring member from the collecting electrode of the solar cell, and cell breakage can be prevented, so that the reliability of the module can be secured. Particularly, it is preferable that the outermost layer of the second collecting electrode and the outermost layer of the second back electrode are each formed by a plating method because the manufacturing process can be considerably simplified. Although the outermost layer of the second collecting electrode and the outermost layer of the second back electrode may be formed in separate steps, respectively, it is preferably to form these outermost layers at the same time so that the manufacturing process can be simplified.

When the second collecting electrode and the second back electrode each include a plurality of layers, it is preferable to form layers other than the outermost layers in such a manner that the $n^{th}$ layer of the second collecting electrode and the $n^{th}$ layer of the second back electrode (n is a natural number) are mainly composed of the same electroconductive material, and it is preferable that all these layers are formed by a plating method. For example, when the second collecting electrode and the second back electrode each include two layers, by ensuring that the second layers of these electrodes are mainly composed of the same electroconductive material, and also the first layers of these electrodes are mainly composed of the same electroconductive material, the thermal expansion coefficients of the first layer of the second collecting electrode and the first layer of the second back electrode can be equivalent to each other, and therefore influences of thermocompression-bonding of the wiring member can be more reliably prevented.

Explanations have been provided principally for the case of the heterojunction solar cell. A solar cell using a crystalline silicon substrate, like the heterojunction solar cell, has a high current value, so that generally the electricity generation loss due to a contact resistance between the transparent electrode layer and the collecting electrode tends to be remarkable. In contrast, in the present invention, the collecting electrode having the first collecting electrode and the second collecting electrode has low contact resistance with the transparent electrode layer, thus making it possible to reduce the electricity generation loss resulting from contact resistance.

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a pin junction or a pn junction of an amorphous silicon-based thin-film or a crystalline silicon-based thin-film; compound semiconductor solar cells such as CIS and CIGS; and organic thin-film solar cells, such as dye-sensitized solar cells and organic thin-film (electroconductive polymer).

EXAMPLES

The present invention will be more specifically described below by showing examples relating to the heterojunction solar cell shown in FIG. 6, but the present invention is not limited to the Examples below.

[Measurement of Surface Roughness]

Surface roughnesses Ra1 and Ra2 of a first collecting electrode and a second collecting electrode were measured in accordance with JIS B 0601: 2001 (corresponding to ISO 4287: 1997) using a laser microscope VK-8510 manufactured by KEYENCE CORPORATION. The surface roughness of the first collecting electrode was measured before formation of the second collecting electrode. In the case where the second collecting electrode had a two-layer structure, the surface roughness of the first layer was measured before formation of the second layer.

[Measurement of Viscosity]

The viscosity of a printing paste was measured at a solution temperature of 25° C. and a rotation speed of 10 rpm by a rotational viscometer manufactured by Brookfield, Inc.

Comparative Example 1

A heterojunction solar cell of Comparative Example 1 was manufactured in the following manner.

An n-type single-crystalline silicon wafer having a light-incident surface direction identical to the (100) surface and having a thickness of 200 μm was provided as a single-crystalline silicon substrate of a first conductivity-type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was mostly etched, and a pyramidal texture surface exposed at the (111) plane was formed.

The wafer after etching was introduced into a CVD apparatus, and at the light-incident side thereof, i-type amorphous silicon was formed with a thickness of 5 nm as an intrinsic silicon-based thin-film $2a$. Conditions for forming i-type amorphous silicon included a substrate temperature of 170° C., a pressure of 100 Pa, a $SiH_4/H_2$ flow ratio of 3/10 and a supplied power density of 0.011 $W/cm^2$. The thickness of the thin-film in this example is a value calculated from a deposition rate determined by measuring the thickness of a thin-film formed on a glass substrate under the same conditions using a spectroscopic ellipsometer (trade name: M2000, manufactured by J.A. Woollam Co. Inc.).

On the i-type amorphous silicon layer $2a$, p-type amorphous silicon was formed with a thickness of 7 nm as a silicon-based thin-film $3a$ of opposite conductivity-type. Conditions for forming the p-type amorphous silicon layer $3a$ included a substrate temperature of 170° C., a pressure of 60 Pa, a $SiH_4/B_2H_6$ flow ratio of 1/3 and a supplied power density of 0.01 $W/cm^2$. The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film $2b$. Conditions for forming the i-type amorphous silicon layer $2b$ were the same as those for the aforementioned i-type amorphous silicon layer $2a$. On the i-type amorphous silicon layer $2b$, an n-type amorphous silicon layer was formed with a thickness of 4 nm as a silicon-based thin-film $3b$ of first conductivity-type. Conditions for forming the n-type amorphous silicon layer $3b$ included a substrate temperature of 170° C., a pressure of 60 Pa, a $SiH_4/PH_3$ flow ratio of 1/2 and a supplied power density of 0.01 $W/cm^2$. The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers $6a$ and $6b$, respectively. The transparent electrode layer was formed by applying a power density of 0.5 $W/cm^2$ in an argon atmosphere at a substrate temperature of room temperature and a pressure of 0.2 Pa using indium oxide as a target.

On the back side transparent electrode layer $6b$, silver was formed with a thickness of 100 nm as a first back electrode 81 by a sputtering method.

On the light-incident side transparent electrode layer $6a$, a first collecting electrode 71 was formed in the following manner. For formation of the first collecting electrode 71, a printing paste (viscosity=80 Pa·s) containing low-melting-point material (Ag file particles with particle size $D_L$=0.3 to 0.7 μm) as electroconductive material and further containing an epoxy-based resin as a binder resin was used. The printing paste was screen-printed using a screen plate of #230 mesh (opening width: l=85 μm) having an opening width (L=40 μm) corresponding a collecting electrode pattern, and dried at 130° C.

The wafer with the first collecting electrode 71 formed thereon was introduced into a CVD apparatus, and a silicon oxide layer (refractive index: 1.5) was formed on the light-incident side with a thickness of 100 nm as an insulating layer 9 by a plasma-enhanced CVD method. Deposition conditions of the insulating layer 9 included a substrate temperature of 135° C., a pressure of 133 Pa, a $SiH_4/CO_2$ flow ratio of 1/20, and a supplied power density of 0.05 $W/cm^2$ (frequency 13.56 MHz). After the deposition, an annealing treatment was carried out at 180° C. for 20 minutes in an air atmosphere.

The substrate subjected to steps up to and including the annealing treatment as described above was introduced into a plating tank. For a plating solution, one obtained by adding additives (product numbers: ESY-2B, ESY-H and ESY-1A, manufactured by C. Uyemura & CO., LTD.) to a solution prepared so that the concentrations of copper sulfate pentahydrate, sulfuric acid, and sodium chloride were 120 g/l, 130 g/l, and 70 mg/l, respectively, was used. Using the plating solution, plating was carried out under conditions including a temperature of 25° C. and a current density of 4 $A/dm^2$, so that on the insulating layer on the first collecting electrode 71 and on the first back electrode 81, copper was uniformly deposited at a thickness of about 10 μm as a first layer 721 of a second collecting electrode and as a first layer 821 of a second back electrode, respectively. Little copper was deposited onto a region where no first collecting electrode was formed.

Thereafter, the substrate was put in another plating tank. A plating solution was prepared by adding the additives to a solution prepared in such a manner that the content of tin (II) ions was 30 g/l and the content of an alkylsulfonic acid mainly composed of methanesulfonic acid was 1 mol/l. Using this plating solution, plating was performed under the condition of a temperature of 25° C. and a current density of 2 $A/dm^2$, so that tin was uniformly deposited as the second layer 722 of the second collecting electrode and the second layer 822 of the second back electrode in a thickness of about 3 μm on the first layer 721 of the second collecting electrode and the first layer of the second back electrode, respectively. Little tin was deposited onto a region where no first collecting electrode was formed. In this way, the second collecting electrode 72 including the first layer 721 and the second layer 722 was formed on the first collecting electrode 71, and the second back electrode 82 including the first layer 821 and the second layer 822 was formed on the first back electrode 81. As a result, the collecting electrode 7 including the first collecting electrode 71 and the second collecting electrode 72 was formed on the light-incident side transparent electrode layer 6a, and the back electrode 8 including the first back electrode 81 and the second back electrode 82 was formed on the back side transparent electrode layer 6b.

Thereafter, the silicon wafer on the cell outer periphery was removed in a width of 0.5 mm by a laser processing apparatus to prepare the heterojunction solar cell 101.

Next, a wiring member composed of a copper foil plated with an alloy solder layer was disposed on each of the collecting electrode and the back electrode of the solar cell. The alloy solder layer had a thickness of 40 μm, and contained 60% by mass of tin and 40% by mass of lead. Thereafter, the solar cell was heated with hot air at 250° C. for 3 seconds from above the wiring member to melt the alloy solder, so that the collecting electrode and the wiring member were connected to each other, and the back electrode and the wiring member were connected to each other.

A solar cell with the wiring member connected thereto was provided in the manner described above, and glass, EVA (sealing material), the solar cell, EVA, and a back surface protective sheet were laminated in this order. Thereafter, the laminate was heated and compressed at atmospheric pressure for 5 minutes to seal the solar cell with the EVA resin. Subsequently, the laminate was held at 150° C. for 50 minutes to crosslink the EVA resin, thereby preparing a solar cell module.

Example 1

A heterojunction solar cell was prepared and modularized in the same manner as in Comparative Example 1 except that the viscosity of the printing paste for formation of the first collecting electrode 71 was changed as shown in Table 1.

Examples 2 to 4 and Comparative Example 2

A printing paste containing a low-melting-point material (SnBi metal powder having a particle size $D_L$ of 25 μm and a melting point $T_1$ of 141° C.) and a high-melting-point material (silver powder having a particle size $D_H$ of 2 to 3 μm and a melting point $T_2$ of 971° C.) at a weight ratio of 20:80 as electroconductive materials, and further containing an epoxy-based resin as a binder resin was used as a printing paste for formation of the first collecting electrode 71. The viscosity of the printing paste and particle size of the low-melting-point material contained therein were as shown in Table 1. A heterojunction solar cell was prepared and modularized in the same manner as in Comparative Example 1 except that the aforementioned printing paste was used.

Comparative Example 3

As the back electrode, the first back electrode 81 and the first layer 821 of the second back electrode were formed, and the second layer 822 of the second back electrode was not formed. Except these changes, a heterojunction solar cell was prepared and modularized in the same manner as in Example 2.

Comparative Example 4

Steps up to and including formation of the first collecting electrode (silver electrode) 71 were performed in the same manner as in Comparative Example 1 except that a silver paste containing no low-melting-point material (i.e., the ratio of a metallic material powder to a silver powder was 0:100) was used as a printing paste for formation of a first collecting electrode, and screen printing was performed in a shape corresponding to a collecting electrode pattern, followed by drying at 180° C. Further, steps up to and including formation of the first back electrode (silver electrode) 81 were performed in the same manner as in Comparative Example 1. Thereafter, a heterojunction solar cell having the silver electrodes as a collecting electrode 7 and a back electrode 8 was prepared and modularized without performing any of an insulating layer forming step, an annealing step, a second collecting electrode forming step, and a second back electrode forming step.

[Measurement of Cell Characteristic and Measurement of Module Initial Performance]

Cell characteristic and module initial performance of the heterojunction solar cells according to each Examples and Comparative Examples are measured.

(Peel Strength Test)

A relationship between the surface roughness of the collecting electrode before and after plating and the peel strength of the collecting electrode attached to a wiring member was examined. Specifically, a transparent electrode layer composed of ITO and having a thickness of 100 nm was formed on a glass plate, and a collecting electrode was formed thereon in the same manner as in Examples 1 to 4 and Comparative Examples 1 to 4. A wiring member (a copper foil plated with an alloy solder layer) having a width of 1.5 mm, a copper thickness of 150 μm and an alloy solder thickness of 40 μm was connected onto the collecting electrode. Thereafter, using a peel strength tester (MX-2000N manufactured by IMADA CO., LTD.), the copper foil was stretched at a speed of 40 mm/minute along the normal direction of the wiring member (copper foil), and the maximum load when the copper foil was peeled was defined as a peel strength.

[Temperature Cycle Test]

The temperature cycle test for the solar cell module of each of Examples and Comparative Examples was conducted according to JIS C 8917. The power of each solar cell modules before the temperature cycle test was set to 1, and a ratio of the power before the temperature cycle test to the power after the temperature cycle test, i.e., a retention rate before and after the cycle test, was calculated.

The results of the measurements described above are collectively shown in Table 1. In Table 1, the cell characteristic, module initial performance and peel strength are shown as a relative value with the value in Comparative Example 4 as a reference value (=1).

ment, the first collecting electrode contacted (was conductively connected with) the plating solution, and plating was performed with the opening section as an origination point for deposition.

From Table 1, it is apparent that by changing the viscosity of the printing paste for formation of the first collecting electrode 71 or the particle size of the low-melting-point material that is used as an electroconductive material, the surface roughness Ra1 of the first collecting electrode, the surface roughness Ra2' of the first layer of the second collecting electrode, and the surface roughness Ra2 of the second layer of the second collecting electrode can be changed.

Comparison between Comparative Example 1 and Example 1, comparison between Example 2 and Example 3 and comparison between Example 4 and Comparative Example 2 show that when the viscosity of the printing paste is increased, the surface roughness Ra1 of the first collecting electrode increases, and accordingly, the surface roughness Ra2' of the first layer of the second collecting electrode and the surface roughness Ra2 of the second layer of the second collecting electrode increase. Comparison between Example 2 and Example 4 and comparison between Example 3 and Comparative Example 2 show that when the particle size of the low-melting-point material is increased, the surface roughness Ra1 of the first collecting electrode, the surface roughness Ra2' of the first layer of the second collecting

TABLE 1

| | first collecting electrode | | | | | second collecting electrode | | | | | | | | |
| | | | | | | first layer | | second layer | | back | | | | | |
| | low-melting-point material | low-melting-point material particle size μm | high-melting-point material | printing paste viscosity pa · sec at 25° C. | ra1 μm | ra2' μm | electro-con-ductive material | ra2 μm | electro-con-ductive material | electrode com-ponent material | insu-lating layer | cell charac-teristic | module initial perform-ance | peel strength | reten-tion rate |
|---|---|---|---|---|---|---|---|---|---|---|---|---|---|---|---|
| Compar-ative Example 1 | Ag fine particle | 0.5 | none | 80 | 0.9 | 0.8 | copper | 0.6 | tin | silver/copper/tin | present | 1.01 | 1.002 | 1.03 | 0.95 |
| Example 1 | Ag fine particles | 0.5 | none | 300 | 1.8 | 1.5 | copper | 1.1 | tin | silver/copper/tin | present | 1.03 | 1.005 | 1.18 | 0.98 |
| Example 2 | SnBi | 25 | silver | 80 | 6.2 | 5.0 | copper | 3.8 | tin | silver/copper/tin | | 1.03 | 1.007 | 1.22 | 0.98 |
| Example 3 | | 25 | silver | 300 | 7.1 | 5.4 | copper | 4.1 | tin | silver/copper/tin | | 1.03 | 1.008 | 1.24 | 0.99 |
| Example 4 | | 50 | silver | 80 | 9.6 | 8.1 | copper | 7.4 | tin | silver/copper/tin | | 1.03 | 1.007 | 1.19 | 0.96 |
| Compar-ative Example 2 | SnBi | 50 | silver | 300 | 11.3 | 10.4 | copper | 10.1 | tin | silver/copper/tin | present | 1.03 | 1.004 | 1.16 | 0.93 |
| Compar-ative Example 3 | | 25 | silver | 80 | 6.5 | 5.4 | copper | 3.7 | tin | silver/copper | | 1.03 | 1.005 | 1.09 | 0.93 |
| Compar-ative Example 4 | none | none | silver | 80 | 0.5 | 0.5 | none | none | none | silver | absent | 1 | 1 | 1 | 0.92 |

The reason why copper was deposited as the second collecting electrode by the plating step in the Examples 1 to 4 and Comparative Example 1 to 3 is because an opening section was formed in the insulating layer on the first collecting electrode-formed region by the annealing treatelectrode and the surface roughness Ra2 of the second layer of the second collecting electrode can be increased.

From the results, it is considered that by changing the viscosity of the printing paste for formation of the first collecting electrode 71, the particle size of the electroconductive material, or the like, the surface roughness Ra1 of the first collecting electrode, the surface roughness Ra2' of the first layer of the second collecting electrode and the surface roughness Ra2 of the second layer of the second collecting electrode can be controlled.

Comparison of Examples 1 to 4 and Comparative Example 2 with Comparative Example 1 shows that the cell characteristic is improved when Ra1 is 1.0 µm or more. This may be because when Ra1 is 1.0 µm or more, adhesion between the first collecting electrode and the second collecting electrode is improved.

Table 1 show that there is a correlation between the peel strength and the module initial performance. In Examples 1 to 4 and Comparative Examples 1 and 2, the peel strength and the module initial performance were improved as compared to Comparative Example 4. In Examples 1 to 4 and Comparative Example 2 where the surface roughness Ra2 was 1.0 µm or more, the peel strength and the module initial performance were improved as compared to Comparative Example 1 where the surface roughness Ra2 was less than 1.0 µm. In Examples 1 to 3, the peel strength and the module initial performance were improved as the surface roughness Ra2 increased from 1.0 µm.

In Example 3, Example 4 and Comparative Example 2, the peel strength and the module initial performance tended to be reduced as the surface roughness Ra2 further increased. This may be because when the surface roughness Ra2 increases, the conductor (solder) of the wiring member is attached only in the vicinity of projected portions of the collecting electrode, leading to a decrease in attachment area of the conductor and the collecting electrode. From the results, it is considered that the peel strength and the module initial performance are improved particularly when the surface roughness Ra2 is about 3.0 to 5.0 µm.

The peel strength may be influenced principally by connectivity between the second collecting electrode and the conductor of the wiring member, and therefore connectivity between the second collecting electrode and the conductor of the wiring member may be improved particularly when the surface roughness Ra2 is about 3.0 to 5.0 µm. When the surface roughness Ra1 is 1.0 µm or more, adhesion between the first collecting electrode and the second collecting electrode may be increased to improve the peel strength.

It is apparent that the solar cell modules of Examples 1 to 3 and Comparative Example 1 to 4 have a high retention rate after the temperature cycle test as compared to the solar cell module of Comparative Example 4 which has a collecting electrode consisting of a silver paste electrode. Particularly, the solar cell modules of Examples 1 to 4 have a higher retention rate after a temperature cycle test as compared to the solar cell modules of Comparative Examples 1 to 3. This may be because as compared to the solar cells of Comparative Examples 1 to 3, the solar cell modules of Examples 1 to 4 had a higher adhesive strength between the first collecting electrode and the second collecting electrode, and higher connectivity between the second collecting electrode and the wiring member, so that defects such as peeling in a temperature cycle test were suppressed.

It is considered that in the solar cell modules of Examples, the surface roughness Ra1 is equal to or greater than the surface roughness Ra2, so that the adhesive strength between the first collecting electrode and the second collecting electrode can be increased, and further, the surface roughness Ra2 is 1.0 µm or more and 10.0 µm or less, so that connectivity between the second collecting electrode and the conductor of the wiring member can be improved.

Further, comparison between Example 2 and Comparative Example 3 shows that the solar cell module of Example 2 has a higher peel strength, and a higher retention rate after a temperature cycle test. In Comparative Example 3, the main component of the outermost layer of the collecting electrode (tin) is different from the main component of the outermost layer of the back electrode (copper), whereas in Example 2, the main component of the outermost layer of the collecting electrode (tin) is the same as the main component of the outermost layer of the back electrode (tin). Accordingly, it is considered that in Example 2, the degree of expansion and shrinkage of the material with respect to a temperature change is approximately the same on the light-receiving side and on the back side, and thus adhesion increases, so that detachment hardly occurs.

As described above by showing examples, according to the present invention, the conversion efficiency and reliability of the solar cell module can be improved by using a solar cell including a specific collecting electrode and back electrode.

LIST OF REFERENCE CHARACTERS 100, 101, 102: solar cell
200: solar cell module
201: light-incident side protective material
202: back side protective material
203: sealing material
34: wiring member
341: core material
342: conductor
343: electroconductive adhesive
50: photoelectric conversion section
1: single-crystalline silicon substrate of first conductivity-type
2, 2a, 2b: intrinsic silicon-based thin-film
3, 3a, 3b: conductive silicon-based thin-film
6, 6a, 6b: transparent electrode layer
7: collecting electrode
7a: finger electrode
7b: bus bar electrode
71: first collecting electrode
711: low-melting-point material
72: second collecting electrode
721: first layer of second collecting electrode
722: second layer of second collecting electrode
8, 80: back electrode
81, 83: first back electrode
82, 84: second back electrode
821, 841: first layer of second back electrode
822, 842: second layer of second back electrode
9: insulating layer
9h: opening section

The invention claimed is:

1. A solar cell module comprising:
   a solar cell;
   and a wiring member, wherein
   the solar cell includes a photoelectric conversion section, a collecting electrode provided on a light-receiving side of the photoelectric conversion section, and a back electrode provided on a back side of the photoelectric conversion section,
   the collecting electrode includes a plurality of finger electrodes each extending in a first direction, and a bus bar electrode extending in a second direction;
   the bus bar electrode includes a first collecting electrode and a second collecting electrode stacked in this order from a photoelectric conversion section side, the second collecting electrode covering an entire length of the first collecting electrode,
the back electrode includes a first back electrode and a second back electrode stacked in this order from the photoelectric conversion section side,
the second collecting electrode and the second back electrode each have two or more layers,
a surface roughness Ra1 of the first collecting electrode and a surface roughness Ra2 of the second collecting electrode are configured to satisfy Ra1>Ra2 and Ra2=1.0 pm to 10.0 μm,
at least an outermost part of the second collecting electrode and at least an outermost part of the second back electrode are mainly composed of same electroconductive material,
the wiring member is composed of a core material and a conductor that covers a surface of the core material
the bus bar electrode of the solar cell and the conductor of the wiring member are electrically connected to each other, and
the solar cell is electrically connected to another solar cell via the wiring member.

2. The solar cell module according to claim 1, wherein the first collecting electrode is a layer containing a resin, and the second collecting electrode is plated.

3. The solar cell module according to claim 1, wherein
the bus bar electrode further includes an insulating layer provided with an opening section between the first collecting electrode and the second collecting electrode, and
the opening section of the insulating layer conductively connects the second collecting electrode to the first collecting electrode.

4. The solar cell module according to claim 3, wherein
the first collecting electrode contains a material having a thermal-fluidization onset temperature T1 that is lower than a heat-resistant temperature of the photoelectric conversion section.

5. The solar cell module according to claim 1, wherein the second collecting electrode of the bus bar electrode of the solar cell and the conductor of the wiring member are in contact with each other.

6. The solar cell module according to claim 1, wherein the electroconductive material of the outermost part of the second collecting electrode and the conductor of the wiring member are each mainly composed of tin.

7. The solar cell module according to claim 1, wherein
the second collecting electrode includes a first layer of the second collecting electrode and a second layer of the second collecting electrode stacked in this order from the photoelectric conversion section side,
the second back electrode includes a first layer of the second back electrode and a second layer of the second back electrode stacked in this order from the photoelectric conversion section side, and
the second layer of the second collecting electrode and the second layer of the second back electrode are mainly composed of same electroconductive material.

8. The solar cell module according to claim 1, wherein the back electrode has a pattern shape.

9. A method for manufacturing a solar cell module including a solar cell and a photoelectric conversion section,
the solar cell includes a photoelectric conversion section, a collecting electrode provided on a light-receiving side of the photoelectric conversion section, and a back electrode provided on a back side of the photoelectric conversion section,
the collecting electrode includes a plurality of finger electrodes each extending in a first direction, and a bus bar electrode extending in a second direction,
the wiring member is composed of a core material and a conductor that covers a surface of the core material,
the bus bar electrode of the solar cell and the conductor of the wiring member are electrically connected to each other, and
the solar cell is electrically connected to another solar cell via the wiring member, wherein
preparation of the solar cell comprising steps of:
forming a bus bar electrode by forming a first collecting electrode having a surface roughness of Ra1 on a light-receiving side of a photoelectric conversion section and forming a second collecting electrode including two or more layers on an entire length of the first collecting electrode; and
forming a back electrode by forming a first back electrode on a back side of the photoelectric conversion section and forming a second back electrode including two or more layers on the first back electrode, wherein
the second collecting electrode is configured so as to have a surface roughness Rat being larger than Ra1 and in a ranger of 1.0 μm to 10.0 μm, and
at least an outermost part of the second collecting electrode and at least an outermost part of the second back electrode are formed so that each of them are mainly composed of same electroconductive material.

10. The method for manufacturing a solar cell module according to claim 9, wherein the second collecting electrode and the second back electrode are each formed by a plating method.

11. The method for manufacturing a solar cell module according to claim 10, wherein the outermost part of the second collecting electrode and the outermost part of the second back electrode are formed at the same time.

12. The method for manufacturing a solar cell module according to claim 9, wherein
the first collecting electrode is formed using a paste containing a resin, and
the second collecting electrode is formed by a plating method.

13. The method for manufacturing a solar cell module according to claim 9, wherein
formation of the bus bar electrode further includes a step of forming an insulating layer provided with an opening section on the first collecting electrode after forming the first collecting electrode and before forming the second collecting electrode, and
the second collecting electrode is formed by a plating method in such a manner that the second collecting electrode is conductively connected with the first collecting electrode via the opening section of the insulating layer.

14. The method for manufacturing a solar cell module according to claim 13, wherein
the first collecting electrode contains a material having a thermal-fluidization onset temperature $T_1$, and
after the insulating layer is formed and before the second collecting electrode is formed, or at the time when the insulating layer is formed, the first collecting electrode is subjected to an annealing treatment at an annealing temperature Ta that is higher than $T_1$, so that the opening section is formed in the insulating layer.

* * * * *

UNITED STATES PATENT AND TRADEMARK OFFICE
CERTIFICATE OF CORRECTION

PATENT NO. : 10,193,007 B2
APPLICATION NO. : 15/127390
DATED : January 29, 2019
INVENTOR(S) : Toru Terashita and Daisuke Adachi Page 1 of 1

It is certified that error appears in the above-identified patent and that said Letters Patent is hereby corrected as shown below:

In the Claims

In Column 37, Line 12, Claim 1, delete "1.0 pm" and insert --1.0 µm-- and;

In Column 38, Line 28, Claim 9, delete "Rat" and insert --Ra2--.

Signed and Sealed this
Twenty-sixth Day of March, 2019

Andrei Iancu
*Director of the United States Patent and Trademark Office*